(12) United States Patent
Roth et al.

(10) Patent No.: US 8,847,254 B2
(45) Date of Patent: Sep. 30, 2014

(54) LIGHT EMITTING DEVICE

(75) Inventors: Gundula Roth, Levenhagen (DE);
Walter Tews, Greifswald (DE);
Chung-Hoon Lee, Gwangmyeong-Si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/097,741

(22) PCT Filed: Dec. 15, 2006

(86) PCT No.: PCT/KR2006/005500
§ 371 (c)(1),
(2), (4) Date: Oct. 9, 2008

(87) PCT Pub. No.: WO2007/069869
PCT Pub. Date: Jun. 21, 2007

(65) Prior Publication Data
US 2009/0134413 A1    May 28, 2009

(30) Foreign Application Priority Data

Dec. 15, 2005 (KR) .......... 10-2005-0123670
Dec. 14, 2006 (KR) .......... 10-2006-0127793

(51) Int. Cl.
*H01L 29/66* (2006.01)
*H01L 33/50* (2010.01)
*C09K 11/77* (2006.01)
*C09K 11/66* (2006.01)
*H05B 33/10* (2006.01)

(52) U.S. Cl.
CPC ..... *H01L 33/502* (2013.01); *H01L 2224/48247* (2013.01); *H01L 2224/48137* (2013.01); *H01L 2224/48091* (2013.01); *C09K 11/7734* (2013.01); *H01L 2224/32245* (2013.01); *H01L 2224/49107* (2013.01); *H01L 2224/73265* (2013.01); *C09K 11/663* (2013.01); *H05B 33/10* (2013.01)

USPC .............. 257/98; 257/969; 257/E33.005

(58) Field of Classification Search
CPC .......... H01L 33/60; H01L 33/20; H01L 33/62
USPC ......... 257/13, 84, 79, 81, 82, 88, 98, 99, 100, 257/101, 102, 103, 723, 731, E51.02, 257/E51.021, E33.001, E31.001–E31.005, 257/E31.008, E51.022, 94, 95, E33.003, 257/E33.005; 313/486, 496, 768, 799, 500, 313/503, 485; 252/62.3 ZT, 62.3 ZB, 310.4 R
See application file for complete search history.

(56) References Cited

U.S. PATENT DOCUMENTS

| | | |
|---|---|---|
| 2,110,162 A | 3/1938 | Leverenz |
| 2,402,760 A | 6/1946 | Leverenz |

(Continued)

FOREIGN PATENT DOCUMENTS

| | | |
|---|---|---|
| AT | 410266 | 3/2003 |
| CN | 1218084 | 6/1999 |

(Continued)

OTHER PUBLICATIONS

Non-Final Office Action dated Jan. 4, 2013 issued for U.S. Appl. No. 13/279,878.

(Continued)

*Primary Examiner* — Cuong Q Nguyen
*Assistant Examiner* — Yosef Gebreyesus
(74) *Attorney, Agent, or Firm* — H.C. Park & Associates, PLC

(57) ABSTRACT

The present invention relates to a light emitting device comprising at least one light emitting diode which emits light in a predetermined wavelength region, copper-alkaline earth metal based inorganic mixed crystals activated by rare earths, which include copper-alkaline earth silicate phosphors which are disposed around the light emitting diode and absorb a portion of the light emitted from the light emitting diode and to emit light different in wavelength from the absorbed light.

13 Claims, 11 Drawing Sheets

(56) References Cited

U.S. PATENT DOCUMENTS

| | | |
|---|---|---|
| 2,570,136 A | 10/1951 | Lyon |
| 2,617,773 A | 11/1952 | Nagy et al. |
| 2,719,128 A | 9/1955 | Kressin |
| 2,780,600 A | 2/1957 | Wollentin |
| 3,143,510 A | 8/1964 | Bakker |
| 3,598,752 A | 8/1971 | Sisneros |
| 3,644,212 A | 2/1972 | McAllister et al. |
| 3,893,939 A | 7/1975 | DeKalb et al. |
| 3,905,911 A | 9/1975 | Kelsey et al. |
| 4,215,289 A | 7/1980 | De Hair et al. |
| 4,770,950 A | 9/1988 | Ohnishi |
| 4,972,086 A | 11/1990 | Bryan et al. |
| 5,032,316 A | 7/1991 | Takahashi et al. |
| 5,060,118 A | 10/1991 | Penrod et al. |
| 5,188,763 A | 2/1993 | Chenot et al. |
| 5,433,295 A * | 7/1995 | Murphy .................. 187/397 |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |
| 5,965,192 A | 10/1999 | Potter |
| 5,998,925 A | 12/1999 | Shimizu et al. |
| 6,045,722 A | 4/2000 | Leblans et al. |
| 6,066,861 A | 5/2000 | Hohn et al. |
| 6,084,250 A | 7/2000 | Justel et al. |
| 6,156,581 A * | 12/2000 | Vaudo et al. .................. 438/22 |
| 6,373,184 B1 | 4/2002 | Suh et al. |
| 6,472,765 B1 | 10/2002 | Sano et al. |
| 6,482,664 B1 | 11/2002 | Lee et al. |
| 6,565,771 B1 | 5/2003 | Ono et al. |
| 6,670,751 B2 | 12/2003 | Song et al. |
| 6,686,691 B1 | 2/2004 | Mueller |
| 6,797,984 B1 * | 9/2004 | Lin et al. .................. 257/82 |
| 6,842,664 B2 | 1/2005 | Harada et al. |
| 6,982,045 B2 | 1/2006 | Menkara et al. |
| 6,982,048 B1 | 1/2006 | Atwater |
| 6,987,353 B2 | 1/2006 | Menkara et al. |
| 7,019,335 B2 | 3/2006 | Suenaga |
| 7,029,602 B2 | 4/2006 | Oshio |
| 7,045,078 B2 | 5/2006 | Choi |
| 7,138,770 B2 * | 11/2006 | Uang et al. .................. 315/291 |
| 7,189,340 B2 | 3/2007 | Shimomura et al. |
| 7,206,507 B2 | 4/2007 | Lee et al. |
| 7,229,571 B2 | 6/2007 | Ezuhara et al. |
| 7,244,965 B2 | 7/2007 | Andrews et al. |
| 7,332,746 B1 | 2/2008 | Takahashi et al. |
| 7,468,147 B2 | 12/2008 | Shida et al. |
| 7,554,129 B2 * | 6/2009 | Roth et al. .................. 257/100 |
| 7,608,200 B2 | 10/2009 | Seto et al. |
| 7,679,101 B2 | 3/2010 | Ota et al. |
| 7,679,281 B2 | 3/2010 | Kim et al. |
| 8,070,983 B2 | 12/2011 | Roth et al. |
| 8,070,984 B2 | 12/2011 | Roth et al. |
| 8,075,802 B2 | 12/2011 | Roth et al. |
| 8,089,084 B2 | 1/2012 | Roth et al. |
| 2002/0015013 A1 | 2/2002 | Ragle |
| 2002/0130326 A1 | 9/2002 | Tamura et al. |
| 2003/0030063 A1 | 2/2003 | Sosniak et al. |
| 2003/0038295 A1 | 2/2003 | Koda |
| 2003/0168636 A1 | 9/2003 | Dobson et al. |
| 2003/0181122 A1 * | 9/2003 | Collins et al. .................. 445/24 |
| 2004/0051111 A1 | 3/2004 | Ota et al. |
| 2004/0079957 A1 | 4/2004 | Andrews et al. |
| 2004/0104391 A1 | 6/2004 | Maeda et al. |
| 2004/0135504 A1 | 7/2004 | Tamaki et al. |
| 2004/0136891 A1 | 7/2004 | Kijima et al. |
| 2004/0206970 A1 * | 10/2004 | Martin .................. 257/98 |
| 2004/0251809 A1 * | 12/2004 | Shimomura et al. .......... 313/485 |
| 2005/0001225 A1 | 1/2005 | Yoshimura et al. |
| 2005/0001537 A1 | 1/2005 | West et al. |
| 2005/0029529 A1 | 2/2005 | Yukimoto et al. |
| 2005/0029927 A1 | 2/2005 | Setlur et al. |
| 2005/0117334 A1 | 6/2005 | Lee et al. |
| 2005/0139846 A1 | 6/2005 | Park et al. |
| 2005/0141048 A1 * | 6/2005 | Mizutani .................. 358/474 |
| 2005/0239227 A1 | 10/2005 | Aanegola et al. |
| 2005/0264161 A1 | 12/2005 | Oaku et al. |
| 2005/0274930 A1 | 12/2005 | Roth et al. |
| 2005/0274972 A1 | 12/2005 | Roth et al. |
| 2006/0076883 A1 | 4/2006 | Himaki et al. |
| 2006/0138971 A1 | 6/2006 | Uang et al. |
| 2006/0158090 A1 * | 7/2006 | Wang et al. .................. 313/485 |
| 2006/0261309 A1 | 11/2006 | Li et al. |
| 2006/0261350 A1 | 11/2006 | Kawazoe et al. |
| 2006/0267042 A1 | 11/2006 | Izuno et al. |
| 2006/0281203 A1 * | 12/2006 | Epler et al. .................. 438/22 |
| 2007/0029526 A1 | 2/2007 | Cheng et al. |
| 2007/0080355 A1 | 4/2007 | Lin et al. |
| 2007/0247051 A1 | 10/2007 | Kuze et al. |
| 2007/0284563 A1 | 12/2007 | Lee et al. |
| 2008/0036364 A1 | 2/2008 | Li et al. |
| 2008/0067472 A1 | 3/2008 | Roth et al. |
| 2008/0067920 A1 | 3/2008 | Roth et al. |
| 2008/0136347 A1 | 6/2008 | Lin et al. |
| 2008/0224163 A1 | 9/2008 | Roth et al. |
| 2009/0050847 A1 | 2/2009 | Xu et al. |
| 2009/0050849 A1 | 2/2009 | Lee et al. |
| 2009/0152496 A1 | 6/2009 | Roth et al. |
| 2009/0262515 A1 | 10/2009 | Lee et al. |
| 2009/0303694 A1 | 12/2009 | Roth et al. |
| 2010/0002454 A1 | 1/2010 | Lee et al. |
| 2010/0165645 A1 | 7/2010 | Lee et al. |
| 2010/0207132 A1 | 8/2010 | Lee et al. |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 2624578 | 7/2004 |
| CN | 1581503 | 2/2005 |
| CN | 2690724 | 4/2005 |
| CN | 1679177 | 10/2005 |
| CN | 1702809 | 11/2005 |
| CN | 1706043 | 12/2005 |
| CN | 1707819 | 12/2005 |
| DE | 10103422 | 8/2002 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1249873 | 10/2002 |
| EP | 1553641 | 7/2005 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 63-64059 | 4/1988 |
| JP | 03-41390 | 4/1991 |
| JP | 03-228366 | 10/1991 |
| JP | 05-63070 | 3/1993 |
| JP | 05-066718 | 3/1993 |
| JP | 5-78659 | 3/1993 |
| JP | 05-198843 | 8/1993 |
| JP | 05198843 | 8/1993 |
| JP | 05-347433 | 12/1993 |
| JP | 9-40946 | 2/1997 |
| JP | 9-153644 | 6/1997 |
| JP | 9-279140 | 10/1997 |

(56) References Cited

FOREIGN PATENT DOCUMENTS

| | | |
|---|---|---|
| JP | WO98/05078 | 2/1998 |
| JP | WO98/12757 | 3/1998 |
| JP | 10-321914 | 12/1998 |
| JP | 11-177143 | 7/1999 |
| JP | 11-233730 | 8/1999 |
| JP | 2000-260580 | 9/2000 |
| JP | 2000-294387 | 10/2000 |
| JP | 2001-115157 | 4/2001 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97465 | 4/2002 |
| JP | 2002-97466 | 4/2002 |
| JP | 2002-173677 | 6/2002 |
| JP | 2002-531956 | 9/2002 |
| JP | 2002-335019 | 11/2002 |
| JP | 2002-359403 | 12/2002 |
| JP | 2002-368277 | 12/2002 |
| JP | 2003-064358 | 3/2003 |
| JP | 2003-133595 | 5/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-71726 | 3/2004 |
| JP | 2004-71807 | 3/2004 |
| JP | 2004-079867 | 3/2004 |
| JP | 2004-88011 | 3/2004 |
| JP | 2004-127988 | 4/2004 |
| JP | 2004-134699 | 4/2004 |
| JP | 2004-192833 | 7/2004 |
| JP | 2004-284563 | 10/2004 |
| JP | 2005-100799 | 4/2005 |
| JP | 2005-100800 | 4/2005 |
| JP | 2005-101296 | 4/2005 |
| JP | 2005-153606 | 6/2005 |
| JP | 2005-167177 | 6/2005 |
| JP | 2005-354027 | 12/2005 |
| JP | 2006-503431 | 1/2006 |
| JP | 2006-073656 | 3/2006 |
| JP | 2006-173433 | 6/2006 |
| JP | 2006-252944 | 9/2006 |
| JP | 2007-186674 | 7/2007 |
| JP | 2009-007545 | 1/2009 |
| KR | 10-232395 | 12/1999 |
| KR | 20010032450 | 4/2001 |
| KR | 10-2001-0050839 | 6/2001 |
| KR | 20010101910 | 11/2001 |
| KR | 10-2002-0000835 | 1/2002 |
| KR | 10-2002-0053975 | 7/2002 |
| KR | 10-392363 | 7/2002 |
| KR | 10-2002-0079513 | 10/2002 |
| KR | 1020020079513 | 10/2002 |
| KR | 2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0117165 | 12/2005 |
| KR | 1020050117164 | 12/2005 |
| KR | 10-2006-0034056 | 4/2006 |
| KR | 10-2006-0071869 | 6/2006 |
| KR | 10-0626272 | 9/2006 |
| KR | 10-2006-0134728 | 12/2006 |
| KR | 10-2007-0016900 | 2/2007 |
| KR | 10-2007-0050833 | 5/2007 |
| KR | 10-2008-0046789 | 5/2008 |
| TW | I328885 | 3/1999 |
| TW | 546854 | 8/2003 |
| WO | 1996-32457 | 10/1996 |
| WO | 98-39805 | 9/1998 |
| WO | 98-42798 | 10/1998 |
| WO | 00-19546 | 4/2000 |
| WO | 00/33390 | 6/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 03/030274 | 4/2003 |
| WO | 2004/036962 | 4/2004 |
| WO | 2004-085570 | 10/2004 |
| WO | 2004-111156 | 12/2004 |
| WO | 2005068584 | 7/2005 |
| WO | 2005-109532 | 11/2005 |
| WO | 2005-112137 | 11/2005 |
| WO | 2006-043682 | 4/2006 |
| WO | 2006-068359 | 6/2006 |
| WO | 2006-081803 | 8/2006 |
| WO | 2006109659 | 10/2006 |
| WO | 2007-035026 | 3/2007 |
| WO | 2007-055538 | 5/2007 |
| WO | 2007-114614 | 11/2007 |
| WO | 2009-028818 | 3/2009 |

OTHER PUBLICATIONS

Summary Translation of DE 10103422, Aug. 1, 2002, Kaifler, corresponding to U.S. Appl. No. 12/088,906.
Summary Translation of JP 05198843, Aug. 6, 1993, Toshiba Lighting & Technol Corp., corresponding to U.S. Appl. No. 12/088,906.
German Office Action of file No. 11 2006 002 702.6-33 dated Dec. 10, 2009, corresponding to U.S. Appl. No. 12/088,906.
International Search Report of PCT/KR2006/005186 issued on Feb. 26, 2007, corresponding to U.S. Appl. No. 12/088,906.
Written Opinion of PCT/KR2006/005186 issued on Feb. 26, 2007, corresponding to U.S. Appl. No. 12/088,906.
Non-Final Office Action of U.S. Appl. No. 12/088,906 issued on Jun. 10, 2010.
Final Office Action of U.S. Appl. No. 12/088,906 issued on Nov. 1, 2010.
Taiwan Preliminary Notice of First Office Action of Taiwanese Application No. 095146586 dated Jul. 6, 2010.
Advisory Action of U.S. Appl. No. 12/088,906 issued on Jan. 19, 2011.
International Search Report dated Feb. 11, 2009 for PCT Application No. PCT/2008/004733.
Chinese Office Action dated Dec. 28, 2007 issued in China App No. 200580016844.4 corresponding to U.S. Appl. No. 11/568,769.
Chinese Office Action dated Dec. 28, 2007 issued in China App No. 2005800150173 corresponding to U.S. Appl. No. 11/569,060.
Chinese Office Action dated Feb. 15, 2008 issued in Chinese Patent App No. 20051002304.2 corresponding to U.S. Appl. No. 11/024,722.
Van Gool, Philips Res. Rept. Suppl., 3, 1, 1961(pp. 1-9, 30-51, 84-85).
Wanmaker, "Luminescence of Copper-Activated Calcium and Strontium Orthophosphates", Journal of the Electrochemical Society, pp. 1027-1031.
International Search Report dated Mar. 21, 2007 for PCT Application No. PCT/KR2006/005500.
International Search Report dated Jul. 12, 2007 for PCT Application No. PCT/KR2007/001587.
Butler, "Fluorescent Lamp Phosphors", The Pennsylvania State University Press, 1980, pp. 181-182.
Butler, "Fluorescent Lamp Phosphors", The Pennsylvania State University Press, 1980, pp. 175-176.
Bernhardt, Investigations of the Orange Luminescence of $PbMoO_4$ Crystals, Phys. Stat.Sol.(a),91,643,1985, pp. 643-647.
Shionoya, S., et al.(Eds.), "Principal phosphor materials and their optical properties" in Phosphor Handbook, CRC Press, 1999, p. 826.

(56) References Cited

OTHER PUBLICATIONS

Ralchenko, Yu., Kramida, A.E., Reader, J. and NIST ASD Team (2008). NIST Atomic Spectra Database (version 3.1.5), [Online]. Available: http://physics.nist.gov/asd3 [Feb. 27, 2009]. National Institute of Standards and Technology, Gaithersburg, MD.
Yang, "Conversion Fluorescence in Er3+Yb3+Co-Doped Oxy-Fluoride Compound Materials Based on GeO2," Natural Science Journal of Xiangtan University, vol. 23, No. 2, 2001, pp. 37-41.
International Search Report dated Feb. 27, 2009 for PCT Application No. PCT/KR2008/004734.
X.W.Sun, et al. "Pulsed Laser Deposition of Silicate Phosphor Thin Films", Appl. Phys. A, 69, 1999, 5 pages.
W.L. Wanmaker, et al. "Luminescence of Phosphors Based on the Host Lattice ABGe2O6(A,B=Ca,Sr,Ba)" Journal of Solid State Chemistry 3, (1971),pp. 194-196.
N. S. Akhmetov, "Inorganic Chemistry", Moscow "Vysshaya Shkola", 1975; (partial translation; translated pp. 332-333, 372-373, 384-385, 427, 432, 436, 445, 471, 476, 486, 491, 496-497, 501, 546-549).
Markovsky L, Ya. Et al., Phosphors (Moscow-Leningrad, KHIMIYA Publishers, 1966, p. 7 (partial translation).
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting Ba3SiO5:EU2+ Phosphor", Journal of Materials Science 40 (2005), pp. 2069-2071, XP-002511068.
H.G. Kang, et al., Embodiment and Luminescence Properties of Sr3SiO5:Eu(yellow-orange phosphor) by co-doping lanthanide, Solid State Phenomena, vol. 124-126 (2007) pp. 511-514.
G. Roth, et al. "Advanced Silicate Phosphors for improved white LED", Global Phosphor Summit Seoul/Korea, Mar. 5-7, 2007.
T.L. Barry, "Equilibria and Eu2+ luminescence of subsolidus phases bounded by Ba3MgSi2O8, Sr3MgSi2O8 and Ca3MgS12O8," J. Electrochem. Soc., vol. 115 No. 7 (Jul. 1968), pp. 733-738.
G. Blasse, et al., "Fluorescence of Europium2+-activated silicates," Philips Res. Repts 23 (1968), pp. 189-199.
S.D. Jee, et al., "Photoluminescence properties of Eu2+-activated Sr3SiO5 Phosphors," J. Mater Sci. 41 (2006), pp. 3139-3141.
T.L. Barry, "Fluorescence of Eu2+ Activated Phases in Binary Alkaline Earth Orthosilicate Systems", J. Electrochem Soc., Nov. 1968, pp. 1181-1184.
Shenstone, A.G., "The Third Spectrum of Copper(Cu III)", Journal of Research of the National Bureau of Standards—A. Physics and Chemistry, vol. 79A, No. 3, May-Jun. 1975, pp. 497-521.
Lever, A.B.P., "Inorganic Electronic Spectroscopy", 2nd ed., Elsevier, 1984, pp. 355 and 557-559.
Dubicki, Lujcan et al., "The First d-d Fluorescence of a six-Coordinate Copper(II) Ion", J.Am.Chem.Soc., 1989, No. 111, pp. 3452-3454.
Scacco, A., et al., "Optical Spectra of Cu2+0 Ions in LiF Crystals", Radiation Effects and Defects in Solids, vol. 134, 1995, pp. 333-336.
Shionoya, S., et al.(Eds.), "Principal phosphor materials and their optical properties" in Phosphor Handbook, CRC Press, 1999, pp. 231-255.
Yang, Ping et al., "Photoluminescence of Cu+ doped and Cu2+ doped ZnS nanocrystrallites", Journal of Physics and Chemistry of Solids, No. 63, 2002, pp. 639-643.
Suyver, J.F., et al.,"Luminescence of nanocrystalline ZnSe:Cu", Applied Physics Letters, vol. 79, No. 25, Dec. 17, 2001, pp. 4222-4224.
Bol, Ageeth A., et al., "Luminescence of nanocrystalline ZnS:Cu2+", Journal of Luminescence, No. 99, 2002, pp. 325-334.
Non-final office action mailed May 23, 2007 for U.S. Appl. No. 11/024,722, filed Dec. 30, 2004.
Declaration under 37 CFR 1.132 by Ulrich Kynast, dated Aug. 24, 2007.
Final office action dated Oct. 22, 2007 issued in U.S. Appl. No. 11/024,722, filed Dec. 30, 2004.

"Phosphors for Mercury Lamps" https:/www.lamptech.co.uk/documents/M14%20Phosphors.htm 2003 (2 pages).
Search Report dated Apr. 11, 2006 for EP Application No. EP04106880.0.
International Search Report dated Aug. 12, 2005 for PCT Application No. PCT/KR2005/001287.
International Search Report dated Aug. 12, 2005 for PCT Application No. PCT/KR2005/001288.
International Search Report dated Oct. 13, 2005 for PCT Application No. PCT/KR2005/002333.
International Search Report dated Oct. 24, 2005 for PCT Application No. PCT/KR2005/002332.
International Search Report dated Feb. 20, 2007 for PCT Application No. PCT/KR2006/004716.
Notice of Allowance dated May 4, 2009 issued in U.S. Appl. No. 11/024,702.
Lee, Chung-Hoon, et al., Unpublished U.S. Appl. No. 12/440,001; corresponds to WO2009-028818.
Search Report dated Aug. 21, 2007 for EP Application No. EP04106882.6.
Search Report dated Nov. 5, 2008 for EP Application No. EP06812549.1.
Search Report dated Feb. 2, 2009 for EP Application No. EP08014684.
Chen, R., "Developments in Luminescence and Display Materials Over the Last 100 Years as reflected in Electrochemical Society Publications", Journal of Electrochemical Society, 149, pp. 69-78.
G. Blasse, B.C. Grabmeier, "Luminescent Materials", Springer, 1994, pp. 40-47.
G. Blasse and A. Bril, "Characteristic Luminescence", Philips Technical Review, 31 (1970) 304, pp. 306 & 310.
S. Shionoya, W.M. Yen, "Phosphor Handbook" CRC Press, 1999, Ch. 3.3, pp. 179-182.
G. Blasse, B.C. Grabmeier, "Luminescent Materials", Springer, 1994, p. 25.
J. Garcia Sole, L.E. Bausa, D. Jaque, "An Introduction to the Optical Spectroscopy of Inorganic Solids", Wiley, 2005, pp. 163-164.
P.A. Cox, "Transition Metal Oxides", Oxford University Press, 1995, p. 105.
G.L. Miessler, D.A. Tarr, "Inorganic Chemistry", 3rd ed., Pearson/Prentice Hall, pp. 117-118.
B. Cordero, et al. "Covalent Radii Revisited", Dalton Trans., (2008), pp. 2832-2838.
G. Blasse, B.C. Grabmeier, "Luminescent Materials", Springer, 1994, pp. 87-90.
Feldman, C., "Inorganic Luminescent Materials: 100 Years of Research and Application", Adv. Funct. Matter, 2003, pp. 511-516.
Blasse, G., "Characteristic Luminescence", Philips Technical Review, vol. 31 (1970), pp. 304-332.
Declaration Under Rule 37 CFR 1.132 of Ulrich Kynast dated Sep. 6, 2008.
Shionoya, "Phosphor Handbook", CRC Press, pp. 183-184.
Garcia Sole, et al., "An Introduction to the Optical Spectroscopy of Inorganic Solids", pp. 132-133.
R.J. Angel et al., "Structure and twinning of single-crystal MgSiO3 garnet synthesized at 17 GPa and 1800° C.", American Mineralogist, 74 (1989) pp. 509-512.
Non-final office action dated Jan. 13, 2010 issued in U.S. Appl. No. 11/569,060, filed Jun. 22, 2007.
Non-final office action dated Nov. 2, 2009 issued in U.S. Appl. No. 12/098,263, filed Apr. 4, 2008.
Non-final office action dated Nov. 14, 2008 issued in U.S. Appl. No. 11/024,722, filed Dec. 30, 2004.
Non-final office action dated May 29, 2009 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated Nov. 29, 2006 issued in U.S. Appl. No. 11/024,722, filed Dec. 30, 2004.
Non-final office action dated Nov. 29, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.

(56) References Cited

OTHER PUBLICATIONS

Final office action dated Feb. 7, 2007 issued in U.S. Appl. No. 11/024,702, filed Dec. 30, 2004.
Lee, Chung-Hoon, et al., Unpublished U.S. Appl. No. 12/491,780.
European Search Report of Sep. 23, 2010 in European Patent Appl. No. 10 16 4970.
TW Office Action of Sep. 10, 2010 in TW Patent Appl. No. 098123458.
IP Australia Office Action dated Jul. 2, 2010 for AU Patent Appl. No. 2005-319965, corresponding to U.S. Appl. No. 12/098,263.
Non-Final Office Action dated Aug. 10, 2010 in U.S. Appl. No. 12/731,811.
Non-Final Office Action dated Aug. 18, 2010 in U.S. Appl. No. 11/948,813.
European Search Report of Oct. 26, 2010 in EP 10 17 7817, corresponding to U.S. Appl. No. 11/024,722.
CN Office Action dated Feb. 5, 2010 in CN Appl. No. 2005100023042.
Final Office Action dated Sep. 9, 2010 in U.S. Appl. No. 11/568,769.
Non-Final Office Action dated Apr. 30, 2010 in U.S. Appl. No. 11/568,769.
Final Office Action dated Jun. 21, 2010 in U.S. Appl. No. 11/569,060.
Non-Final Office Action dated Aug. 10, 2010 in U.S. Appl. No. 11/024,722.
EP Search Report dated Oct 6, 2010 in EP Appl No. 07745750.5—corresponding to U.S. Appl. No. 12/295,438.
EP Search Report dated Sep. 1, 2010 in EP Appl No. 08015119 correpsonding to U.S. Appl. No. 12/440,001.
Non Final Office Action dated Aug. 17, 2010 in U.S. Appl. No. 11/948,845.
Non Final Office Action dated Mar. 17, 2010 in U.S. Appl. No. 11/024,722.
Final Office Action dated May 11, 2010 in U.S. Appl. No. 12/098,263.
Notice of Allowance dated Aug 18, 2010 in U.S. Appl. No. 12/098,263.
Non Final Office Action dated Nov. 30, 2010 in U.S. Appl. No. 12/196,923.
Final Office Action dated Nov. 30, 2010 in U.S. Appl. No. 11/024,722.
Non Final Office Action dated Nov. 24, 2010 in U.S. Appl. No. 12/093,441.
Non Final Office Action dated Nov. 26, 2010 in U.S. Appl. No. 12/440,001.
Final Office Action dated Dec. 7, 2010 in U.S. Appl. No. 11/948,845.
Non Final Office Action dated Dec. 29, 2010 in U.S. Appl. No. 12/731,811.
Final Office Action dated Dec. 23, 2010 in U.S. Appl. No. 11/569,060.
Final Office Action dated Dec. 8, 2010 in U.S. Appl. No. 11/948,813.
International Search Report for PCT/KR2010/003302 issued on Jan. 3, 2011, corresponding to U.S. Appl. No. 12/767,253.
International Search Report for PCT/KR2010/003285 issued on Jan. 24, 2011, corresponding to U.S. Appl. No. 12/773,514.
Bogner et al., DE 102 33 050 A1, Feb. 5, 2004, Machine Traslation.
Non-Final Office Action of U.S. Appl. No. 11/568,769 issued on Feb. 16, 2011.
Non-Final Office Action of U.S. Appl. No. 13/004,554 issued on Mar. 15, 2011.
Notice of Allowance of U.S. Appl. No. 11/024,722 issued on Mar. 10, 2011.
Final Office Action of U.S. Appl. No. 12/196,923 issued on Mar. 4, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP/2007 issued on Jan. 28, 2011, corresponding to U.S. Appl. No. 12/098,263.
Non-Final Office Action of U.S. Appl. No. 12/854,001 issued on Apr. 6, 2011.
Chinese Office Action of Chinese Patent Application No. 200880105091.8 issued on Apr. 1, 2011.
Notice of Allowance of U.S. Appl. No. 13/004,554 mailed on Dec. 13, 2011.
Chinese Office Action of Chinese Patent Application No. 201010185274.4 issued on Mar. 2, 2011.
Austrian Office Action for AT Application No. 9514/2005 issued on Jun. 1, 2011.
Austrian Office Action for AT Application No. 1545/2010-1 issued on May 31, 2011.
Final Office Action of U.S. Appl. No. 12/731,811 issued on Jul. 29, 2011.
Notice of Allowance of U.S. Appl. No. 11/948,813 issued on Aug. 22, 2011.
Final Office Action of U.S. Appl. No. 12/854,001 issued on Oct. 11, 2011.
Notice of Allowance of U.S. Appl. No. 12/098,263 issued on Oct. 11, 2011.
Non-Final Office Action of U.S. Appl. No. 12/491,780 dated on Dec. 7, 2011.
Non-Final Office Action of U.S. Appl. No. 12/295,438 dated on Jan. 12, 2012.
Non-Final Office Action dated Apr. 2, 2012 issued for U.S. Appl. No. 13/279,878.
Notice of Allowance dated Apr. 11, 2012 issued for U.S. Appl. No. 12/093,441.
Final Office Action dated Apr. 18, 2012 issued for U.S. Appl. No. 12/491,457.
Chinese Office Action of Chinese Patent Application No. 201010198537.5 issued on Mar. 18, 2011.
Non-Final Office Action dated Apr. 24, 2012 issued for U.S. Appl. No. 12/854,001.
Final Office Action dated Apr. 26, 2012 issued for U.S. Appl. No. 12/491,780.
Extended European Search Report dated May 21, 2012 issued for European Patent Application No. 06 83 5220.2.
Butler, "Flourescent Lamp Phosphors", The Pennsylvania State University Press, 1980, pp. 281-284.
Wanmaker, Luminescence of Copper-Activated Orthophosphates of the Type ABPO (A=Ca, Sr, or Ba and B=Li, Na or K, Journal of the Electrochemical Society, pp. 109-113.
Shinonoya, "Phosphor Handbook", edited under the auspice of Phosphor Research Society, CRC Press, 1998, pp. 238-239, 241.
van Gool, Philips Res. Rept. Suppl., 3, 1, 1961, cover page.
van Gool, Philips Res. Rept. Suppl., 3, 1, 1961 (pp. 1-9, 30-51, 84-85).
First Office Action issued Nov. 20, 2009 by the State Intellectual Property Office of the People's Republic of China in Chinese Patent Application No. 200680047280.5.
Preliminary Notice of First Office Action with Search Report issued on May 15, 2013 in Taiwanese Patent Application No. 095147024.

\* cited by examiner

LIGHT EMITTING DEVICE

RELATED APPLICATIONS

This application is a U.S. national phase application of PCT International Application No. PCT/KR2006/005500, filed Dec. 15, 2006, which claims priority of Korean Patent Application No. 2005-0123670, filed Dec. 15, 2005, and also to Korean Patent Application No. 2006-0127793, filed Dec. 14, 2006, the contents of which are incorporated herein by reference in their entirety.

BACKGROUND OF THE INVENTION

1. Field of the Invention

The invention relates to light emitting devices and more particularly to light emitting devices including at least one light-emitting diode and phosphor, the phosphor including copper and converting the wavelength of light which is generated from a light-emitting diode.

2. Description of the Related Art

Light emitting diodes (LEDs), which have been used for electronic devices, are recently used for automobiles and illumination products. Since light emitting devices have superior electrical and mechanical characteristics, demands for light emitting devices expected to be increased. In connection to this, interests in white LEDs are increasing as an alternative to fluorescent lamps and incandescent lamps.

In LED technology, solution for realization of white light is proposed variously. Normally, realization of white LED technology is to put the phosphor around the light-emitting diode, and mix a part of primary emission from the light emitting diode and the secondary emission, which is converted the wavelength by the phosphor. For example, WO 98/05078 and WO 98/12757, disclose white light emitting diodes comprising, a blue light emitting diode, which is capable of emitting a peak wavelength at 450-490 nm, and YAG group material, which absorbs light from the blue light emitting diode and emits yellowish light (mostly), which may have different wavelength from that of the absorbed light.

However, in such an usual white LED, color temperature range is narrow which is between about 6,000-8,000K, and CRI (Color Rendering Index) is low which is about 60 to 75 so that only cold bluish white light is provided. Therefore, it is hard to produce the white LEDs with desired color coordination or color temperature, and particularly, there is limit of realizing the light similar to visible sunlight.

Moreover, white LEDs which are using humidity-sensitive phosphors have unstable luminescent properties in water, vapor or polar solvent, and this unstableness may cause changes in the luminescent properties of white LED.

Generally, a light emitting device for general illumination comprises a plurality of packed white LEDs, manufactured in a separate process, a printed circuit board on which the white LEDs are mounted, a protecting circuit and/or AC/DC inverter connected to the white LEDs, the LEDs being connected to each other via a circuit pattern formed on the printed circuit board.

However, to manufacture a light emitting device for general illumination having the aforementioned structure according to the prior art, there is a problem in that the metal wiring process should be performed for a large number of elements one by one so that processing steps increase in number and are complicated. As the number of the process steps increases, a fraction defective also increases, thereby impeding mass production. Further, there may be a case where metal wiring becomes an open circuit due to a certain shock so that the operations of light emitting elements are stopped. Furthermore, there is a disadvantage in that spaces occupied due to serial array of respective package of light emitting elements are expanded so that the size of a light emitting device for general illumination considerably becomes large.

SUMMARY OF THE INVENTION

An object of the present invention is to provide a wavelength converting light emitting device, which have high color temperature range about 2,000K to 8,000K or 10,000K and CRI over 90.

Another object of the present invention is to provide a wavelength-converting light emitting device which can readily provide desired color coordinates or color temperatures.

Further object of the present invention is to provide a light emitting device with improved luminescent properties and also with improved stability against water, humidity as well as other polar solvents.

Still further object of the present invention is to provide a light emitting device which is capable of applying on electronic devices such as home appliance, stereo, telecommunication products, but also for various kinds of display, automobile, medical instrument, measuring instrument and illumination products.

Still further object of the present invention is to provide a light emitting device which emits white light with a household AC power source by connecting a plurality of light emitting cells in series at a wafer level.

DETAILED DESCRIPTION OF THE PREFERRED EMBODIMENT

Figure 1:
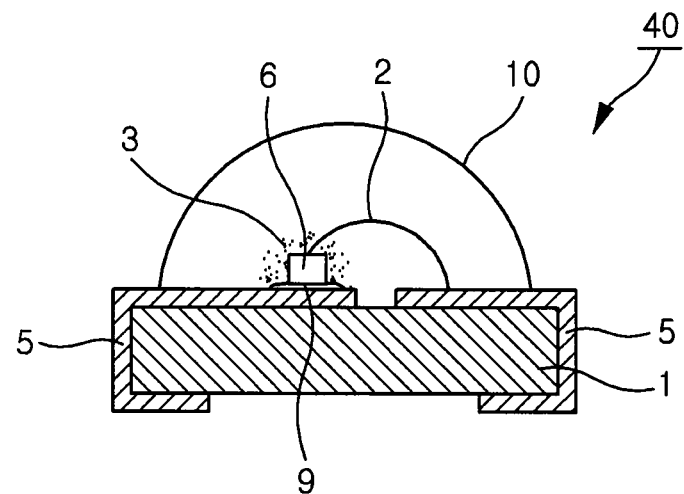
FIG. 1 shows a side cross-sectional view of an illustrative embodiment of a portion of a chip-type package light emitting device consistent with this invention.

Provided is a light emitting device which comprises at least one light emitting diode capable of producing light in a predetermined wavelength region, and a phosphor comprising a chemical compound which includes copper-alkaline earth metal based inorganic mixed crystals and is activated by rare earths, said phosphor being positioned around the light emitting diode so as to absorb a portion of the light emitted from the light emitting diode and to emit light different in wavelength from the absorbed light.

The compound activated by the rare earth includes a copper-alkaline-earth dominated mixed silicate which is expressed in Formula 1:

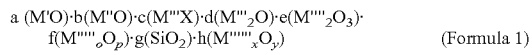
(Formula 1)

wherein M' is Cu;

M" is at least one or more divalent elements from the group consisting of Be, Mg, Ca, Sr, Ba, Zn, Cd, and Mn;

M''' is at least one or more monovalent elements from the group consisting of Li, Na, K, Rb, Cs, Au, and Ag;

M'''' is at least one or more elements from the group consisting of B, Al, Ga, and In;

M''''' is at least one or more elements from the group consisting of Ge, V, Nb, Ta, W, Mo, Ti, Zr, and Hf;

M'''''' is at least one or more elements from the group consisting of Bi, Sn, Sb, Sc, Y, La, Ce, Pr, Nd, Pm, Sm, Eu, Gd, Th, Dy, Ho, Er, Tm, Yb, and Lu;

X is at least one or more elements from the group consisting of F, Cl, Br, and I;

$0 < a \leq 2$;
$0 < b \leq 8$;
$0 \leq c \leq 4$;
$0 \leq d \leq 2$;
$0 \leq e \leq 2$;
$0 \leq f \leq 2$;
$0 \leq g \leq 10$;
$0 < h \leq 5$;
$1 \leq o \leq 2$;
$1 \leq p \leq 5$;
$1 \leq x \leq 2$; and
$1 \leq y \leq 5$.

The compound activated by the rare earth includes a copper-alkaline-earth dominated mixed crystal germanate and/or a germanate-silicate which is expressed in Formula 2:

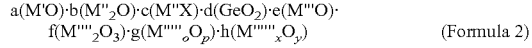
(Formula 2)

wherein M' is Cu;

M" is at least one or more monovalent elements from the group consisting of Li, Na, K, Rb, Cs, Au, and Ag;

M''' is at least one or more divalent elements from the group consisting of Be, Mg, Ca, Sr, Ba, Zn, Cd, and Mn;

M'''' is at least one or more trivalent elements from the group consisting of Sc, Y, B, Al, Ga, In, and La;

M''''' is at least one or more elements from the group consisting of Si, Ti, Zr, Mn, V, Nd, Ta, W, Mo, Hf and Nb;

M'''''' is at least one or more elements from the group consisting of Bi, Sn, Pr, Sm, Eu, Gd, Dy, and Tb;

X is at least one or more elements from the group consisting of F, Cl, Br, and I; and $0 < a \leq 2$;
$0 \leq b \leq 2$;
$0 \leq c \leq 10$;
$0 < d \leq 10$;
$0 \leq e \leq 14$;
$0 \leq f \leq 14$;
$0 \leq g \leq 10$;
$0 \leq h \leq 2$;
$1 \leq o \leq 2$;
$1 \leq p \leq 5$;
$1 \leq x \leq 2$; and
$1 \leq y \leq 5$.

A concentration of Strontium of the copper-alkaline-earth dominated mixed crystal is preferably less than 0.4 Mol/Mol phosphor.

The said compound converts one or more ultraviolet radiation in the range of 300-400 nm and/or blue radiation in the range of 380-500 nm to produce light in the visible region of the spectrum up to a high color rendering index Ra>90. The compound is used in LED as a single phosphor and/or a mixture of a plurality of single phosphors for realizing white light with a color rendering up to Ra>90. The phosphors are disposed on one of a side surface, a top surface or a bottom surface, or mixed with paste or sealing material.

The present invention features the combination of the light emitting diode with the phosphor in the package. In this connection, the package has at least one light emitting diode mounted on the reflector-formed substrate, with the phosphor arranged around the light emitting diode. The light emitting diode and the phosphor on the substrate are sealed with a sealing material. The phosphor is evenly distributed within the sealing material.

The package comprises a heat sink for dissipating the heat generated from the light emitting diode, with the phosphor arranged around the light emitting diode, and can be adapted for high power.

The light emitting diode has a vertical, horizontal and flip-chip structure and comprises a plurality of light emitting cells which is connected to one another in series or parallel on a single substrate. At this time, the light emitting cells are a vertical, horizontal and flip-chip type and further comprise a rectifying bridge unit for applying rectified power to the light emitting cells which are connected to one another in series. Light emitting cell blocks with a plurality of light emitting cells connected in series may be connected in reverse parallel on the substrate.

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like components are designated by like reference numerals.

FIG. 1 shows a side cross-sectional view of an illustrative embodiment of a portion of a chip-type package light emitting device consistent with this invention.

The chip-type package light emitting device may comprise at least one light emitting diode and a phosphorescent substance. Electrode patterns 5 may be formed on both sides of substrate 1. Light emitting diode 6 emitting the primary light may be mounted on one of the electrode patterns 5. Light emitting diode 6 may be mounted on the electrode pattern 5 through electrically conductive paste 9. An electrode of light emitting diode 6 may be connected to the electrode pattern 5 of the other side via an electrically conductive wire 2.

Light emitting diodes may emit light with a wide range of wavelengths, for example, from ultraviolet light to visible light. In one embodiment consistent with this invention, a UV light emitting diode and/or blue light emitting diode may be use. The light emitting diode will be described in detail.

Phosphor, i.e., a phosphorescent substance, 3 may be placed on the top and side faces of the light emitting diode 6. Phosphor 3 converts the wavelength of the primary light from the light emitting diode 6 to another wavelength or other wavelengths. In one embodiment consistent with this invention, the light is in a visible light range after the conversion. Phosphor 3 may be applied to light emitting diode 6 after mixing phosphor 3 with a hardening resin, for example, an epoxy or silicon resin. The hardening resin including phosphor 3 may also be applied to the bottom of light emitting diode 6 after mixing phosphor 3 with electrically conductive paste 9.

The light emitting diode 6 mounted on substrate 1 may be sealed with the hardening resin. Phosphor 3 may be placed on the top and side faces of light emitting diode 6 in a predetermined thickness. Phosphor 3 can also be distributed in the hardened molding potion during the production. Such a manufacturing method is described in U.S. Pat. No. 6,482,664, which is hereby incorporated by reference in its entirety.

Meanwhile, phosphor 3 may comprise a copper doped chemical compound(s). The compounds and phosphor which includes the compounds will be described in detail below. Phosphor 3 preferably includes a rare earth component, and selectively mixed with a single compound or a plurality of single compounds. The single compound may have an emission peak of, for example, from about 440 nm to about 500 nm, from about 500 nm to about 590 nm, or from about 580 nm to 700 nm. Phosphor 3 may include one or more single phosphors, which may have an emission peak as exemplified above.

In regard to chip-type light emitting device 40, an external power is supplied to the light emitting diode 6 via electrode pattern 5. Thereby the light emitting diode may emit primary light when light emitting diode 6 receives power from a power supply. The primary light then may stimulate phosphor(s) 3, and phosphor(s) 3 may convert the primary light to a light with longer wavelength(s) (a secondary light). The primary light from the light emitting diode 6 and the secondary light from the phosphors 3 are diffused and mixed together so that a predetermined color of light in visible spectrum may be emitted from chip-type light emitting device. In one embodiment consistent with this invention, more than one light emitting diodes that have different emission peaks can be mounted together. Moreover, if the mixture ratio of phosphors is adjusted properly, specific color coordination can be provided.

As described above, if the light emitting diode 6 and the compound included in phosphor 3 are properly controlled then desired color temperature or specific color coordination can be provided, especially, wide range of color temperature, for example, from about 2,000K to about 8,000K or about 10,000K and/or color rendering index of greater than about 90. Therefore, the light emitting devices consistent with this invention may be used for electronic devices such as home appliances, stereos, telecommunication devices, and for interior/exterior custom displays. The light emitting devices consistent with this invention may also be used for automobiles and illumination products because they provide similar color temperatures and CRI to those of the visible light.

Figure 2:
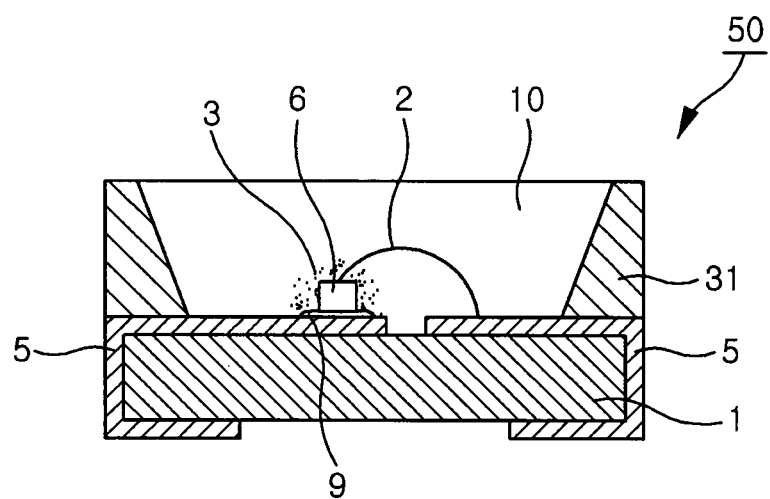
FIG. 2 shows a side cross-sectional view of a second illustrative embodiment of a portion of a top-type package light emitting device consistent with this invention.

FIG. 2 shows a side cross-sectional view of a second illustrative embodiment of a portion of a top-type package light emitting device consistent with this invention.

A top-type package light emitting device 50 (see reference numeral 40 in FIG. 1) consistent with this invention may have a similar structure as that of the chip type package light emitting device 40 of FIG. 1. The top-type package device may have reflector 31 which may reflect the light from the light emitting diode 6 to the desire direction.

The embodiment employs phosphor 3 with the compounds which include a copper-alkaline earth metal based mixed crystal compound activated by rare earths. Phosphor 3 will be explained in detail below.

In top-type package light emitting device 50, more than one light emitting diodes can be mounted. Each of such light emitting diodes may have a different peak wavelength from that of others. Phosphor 3 may comprise a plurality of single compounds with different emission peak. The proportion of each of such plurality of compounds may be regulated. Such a phosphor may be applied to the light emitting diode and/or uniformly distributed in the hardening resin molding portion 10 of the reflector 31.

In one embodiment consistent with this invention, the light emitting device of the FIG. 1 or FIG. 2 can include a metal substrate 1, which may have good heat conductivity. Such a light emitting device may easily dissipate the heat from the light emitting diode. Therefore, light emitting devices for high power may be manufactured. If a radiator (not shown) is provided beneath the metal substrate, the heat from the light emitting diode may be dissipated more effectively.

Figure 3:
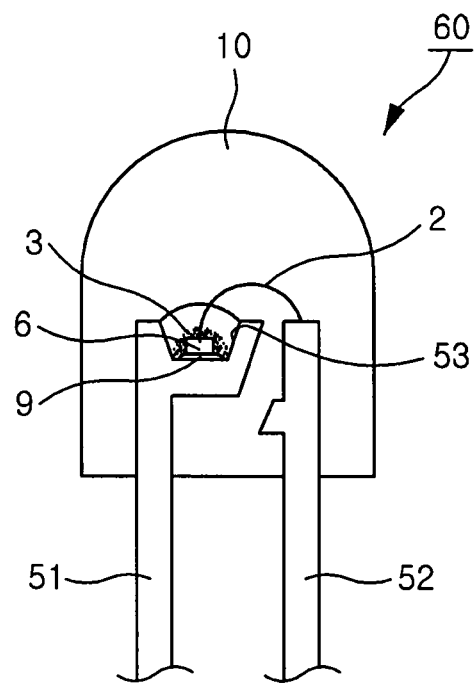
FIG. 3 shows a side cross-sectional view of a third illustrative embodiment of a portion of a lamp-type package light emitting device consistent with this invention.

FIG. 3 shows a side cross-sectional view of a third illustrative embodiment of a portion of a lamp-type package light emitting device consistent with this invention.

Lamp type light emitting device 60 may have a pair of leads 51, 52, and a diode holder 53 may be formed at the end of one lead. Diode holder 53 may have a shape of cup, and at least one light emitting diodes 6 may be mounted inside the diode holder 53. When a number of light emitting diodes are provided in the diode holder 53, each of them may have a different peak wavelength from that of others. An electrode of light emitting diode 6 may be connected to lead 52 by, for example, electrically conductive wire 2.

Regular volume of phosphor 3, which may be mixed in the epoxy resin 54, may be provided in diode holder 53. As explained more fully below, phosphor 3 may include a copper-alkaline earth metal based component activated by rare earth elements.

Phosphor 3 will be explained in detail below.

Moreover, the diode holder 53 may include the light emitting diode 6 and the phosphor 3 may be sealed with hardening material such as epoxy resin or silicon resin.

In one embodiment consistent with this invention, the lamp type package light emitting device 60 may have more than one pair of electrode pair leads.

Figure 4:
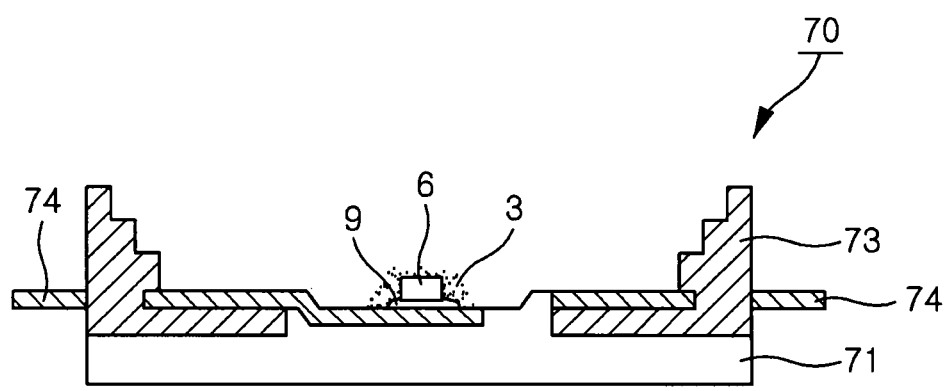
FIGS. 4 and 5 show schematic cross-sectional views of a forth illustrative embodiment of a portion of a light emitting device for high power consistent with this invention.
Figure 5:
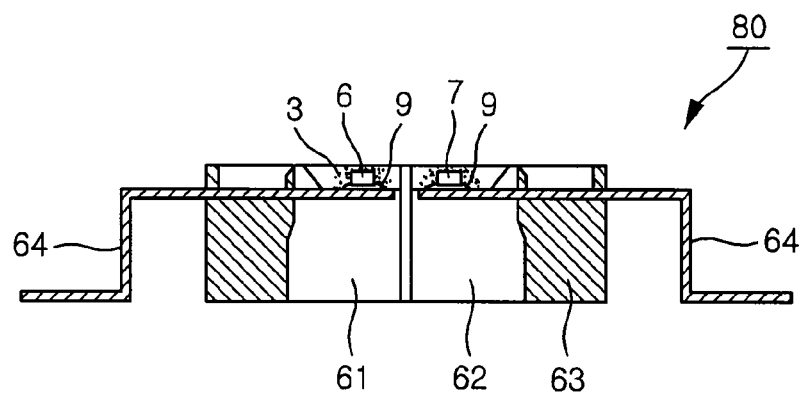

FIGS. 4 and 5 show schematic cross-sectional views of a fourth illustrative embodiment of a portion of a light emitting device for high power consistent with this invention.

Heat sink 71 may be provided inside of housing 73 of the light emitting device for high power light emitting device 70, and it may be partially exposed to outside. A pair of lead frame 74 may protrude from housing 73. At least one light emitting diode may be mounted on the heat sink 71, and an electrode of the light emitting diode 6 and another lead frame 74 may be connected via electrically conductive wire. The phosphor 3 may be placed on top and side faces of light emitting diode 6.

FIG. 5 shows a side cross-sectional view of another illustrative embodiment of a portion of a light emitting device for high power 80 consistent with this invention. Light emitting device for high power 80 may have housing 63, which may contain light emitting diodes 6, 7, phosphor 3 arranged on the top and side faces of light emitting diodes 6, 7, one or more heat sinks 61, 62, and one or more lead frames 64. The lead frames 64 may receive power from a power supplier and may protrude from housing 63.

In the light emitting devices for high power 70, 80 in the FIGS. 4 and 5, the phosphor 3 can be added to the paste, which may be provided between heat sink 61, 62 and light emitting devices 6, 7. A lens may be combined with housing 63, 73.

In a light emitting device for high power 70, 80 consistent with this invention, one or more light emitting diodes 6, 7 can be used selectively and the phosphor can be regulated depending on the light emitting diode. As explained more fully below, the phosphor may include a rare earth and copper doped components.

A light emitting device for high power consistent with this invention may have a radiator (not shown) and/or heat sink(s) 61, 62. Such a light emitting device may easily dissipate the heat from the light emitting diode 6, 7, when the light emitting diode is operated by receiving high power. Air or a fan may be used to cool the radiator in a forced circulation system.

The light emitting devices consistent with this invention is not limited to the structures described above, and the structures can be modified depending on the characteristics of light emitting diodes, phosphor, wavelength of light, and also applications. Moreover, new part can be added to the structures.

The light emitting element according to the embodiment of the present invention constructed as above will be explained in detail below.

Figure 6:
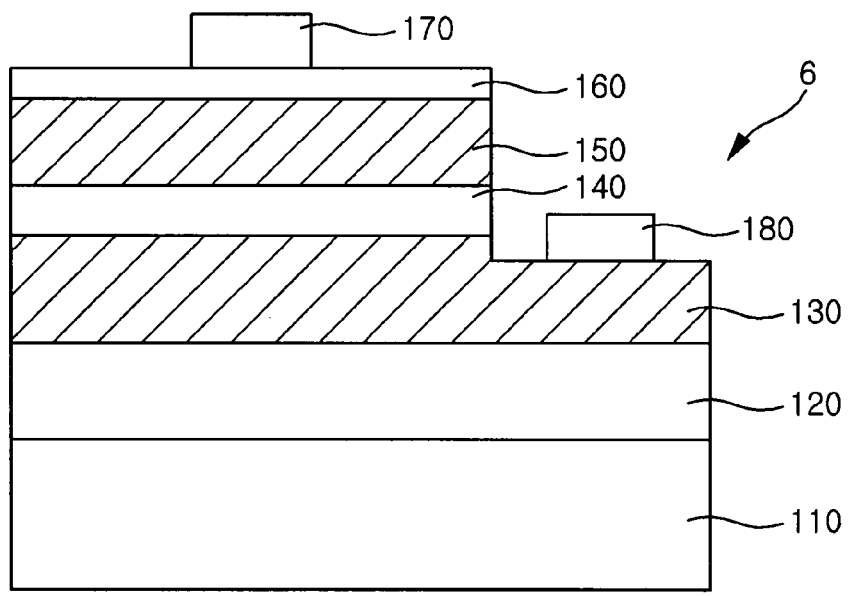
FIG. 6 is a cross sectional view showing a horizontal light emitting diode in accordance with a first modification of the present invention.

FIG. 6 shows a side cross-sectional view of a first modified example of a portion of light emitting diode consistent with this invention.

Referring to FIG. 6, a light emitting diode 6 comprises a substrate 110; a buffer layer 120, an N-type semiconductor layer 130, an active layer 140 and a P-type semiconductor layer 150, which are sequentially laminated on the substrate 110; an N-type bonding pad 180 formed on an exposed region of the N-type semiconductor layer 130 which is exposed by removing a portion of the p-type semiconductor layer 150 and active layer 140; an ohmic contact layer 160 formed on the P-type semiconductor layer 150; and a P-type bonding pad 170 formed on the ohmic contact layer.

It is preferred that the substrate 110 be made of any one of $Al_2O_3$, SiC, ZnO, Si, GaAs, GaP, $LiAl_2O_3$, BN, AlN and GaN according to the characteristics of the semiconductor layer which is formed on the top of the substrate. This embodiment employs a sapphire substrate 110 for crystal growth.

The buffer layer 120 is a layer for reducing lattice mismatch between the substrate 110 and the subsequent layers upon growth of crystals and contains GaN that is a semiconductor material. The buffer layer 120 may has an insulating layer, semi-insulating layer and conductive layer depending on a material of the substrate 110. The N-type semiconductor layer 130 is a layer in which electrons are produced, and is composed of an N-type compound semiconductor layer and an N-type cladding layer. At this time, GaN doped with N-type impurities is used for the N-type compound semiconductor layer. The P-type semiconductor layer 150 is a layer in which holes are produced, and is composed of a P-type cladding layer and a P-type compound semiconductor layer. At this time, AlGaN doped with P-type impurities is used for the P-type compound semiconductor layer.

The active layer 140 is a region in which a predetermined band gap and a quantum well are formed so that electrons and holes are recombined. The active layer 140 contains InGaN. Further, the wavelength of emitted light, which is generated due to the combination of an electron and a hole, varies depending on the kind of a material constituting the active layer 140. Therefore, it is preferred that a semiconductor material contained in the active layer 140 is controlled depending on a target wavelength.

The N-type and P-type bonding pads 180, 170 are metallic pads for use in electrically connecting the light emitting diode 6 to an external conductive wire (see reference numeral 2 in FIG. 1) and may be formed to have a structure with laminated Ti/Au. Further, the aforementioned ohmic contact layer 160 performs the function of uniformly transmitting a voltage input through the P-type boding pad 170 to the P-type semiconductor layer 150. Transparent electrode, ITO is used as the ohmic contact layer 160.

A method of manufacturing the aforementioned horizontal light emitting diode will be briefly described below.

The buffer layer 120, the N-type semiconductor layer 130, the active layer 140 and the P-type semiconductor layer 150 are sequentially formed on the sapphire substrate 110 by means of crystal growth. The ohmic contact layer 160 may be further formed on the P-type semiconductor layer 150. The respective layers are formed through various kinds of deposition and epitaxy methods for depositing the aforementioned materials, including MOCVD (Metal Organic Chemical Vapor Deposition), MBE (Molecular Beam Epitaxy), HVPE (Hydride Vapor Phase Epitaxy), and the like.

Thereafter, a photo etching process using a mask is performed so that a portion of the N-type semiconductor layer 130 is opened. In other words, the P-type semiconductor layer 150, the active layer 140 and the N-type semiconductor layer 130 are partially removed through an etching process using the mask as an etching mask so as to expose a portion of the N-type semiconductor layer 130.

After the mask is removed, the N-type bonding pad 180 is formed on the exposed portion of the N-type semiconductor layer 130 and the P-type bonding pad 170 is formed on the ohmic contact layer 160 of the P-type semiconductor layer 150. Therefore, the horizontal light emitting diode which has the N-type and P-type bonding pad 180, 170 on its horizontal surface may be manufactured.

A vertical light emitting diode will be described below. Descriptions overlapping with the descriptions of the aforementioned horizontal light emitting diode will be omitted below.

Figure 7:
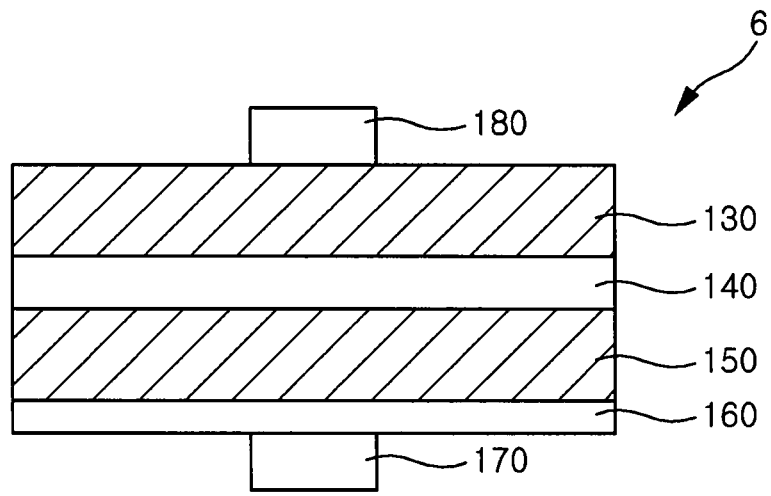
FIG. 7 is a cross sectional view showing a vertical light emitting diode in accordance with a second modification of the present invention.

FIG. 7 shows a side cross-sectional view of a second modified example of a portion of a vertical light emitting device consistent with this invention.

Referring to FIG. 7, in the vertical light emitting diode a P-type pad 170, an ohmic contact layer 160, a P-type semiconductor layer 150, an active layer 140 and an N-type semiconductor layer 130, an N-type pad 180 are sequentially laminated in structure. In other words, P-type pad 170 and N-type pad 180 are respectively formed on the lower portion and upper portion of the light emitting diode as compared to the aforementioned horizontal light emitting diode.

Through the manufacturing process of the vertical light emitting diode, the buffer layer 120, the N-type semiconductor layer 130, the active layer 140, the P-type semiconductor layer 150, the ohmic contact layer 160 and the P-type pad 170 are formed on the substrate 110. Thereafter, a host substrate (not shown) is bonded to the P-type pad 170, and the buffer layer 120 and the substrate below the N-type semiconductor layer 130 are then removed so that the N-type semiconductor layer 130 is exposed. The N-type pad 180 is formed on an exposed portion of the N-type semiconductor layer 130 and vertical light emitting diode may be manufactured.

Below, a description will be given of a flip chip-type light emitting diode. In the following description, parts already explained above are omitted.

Figure 8:
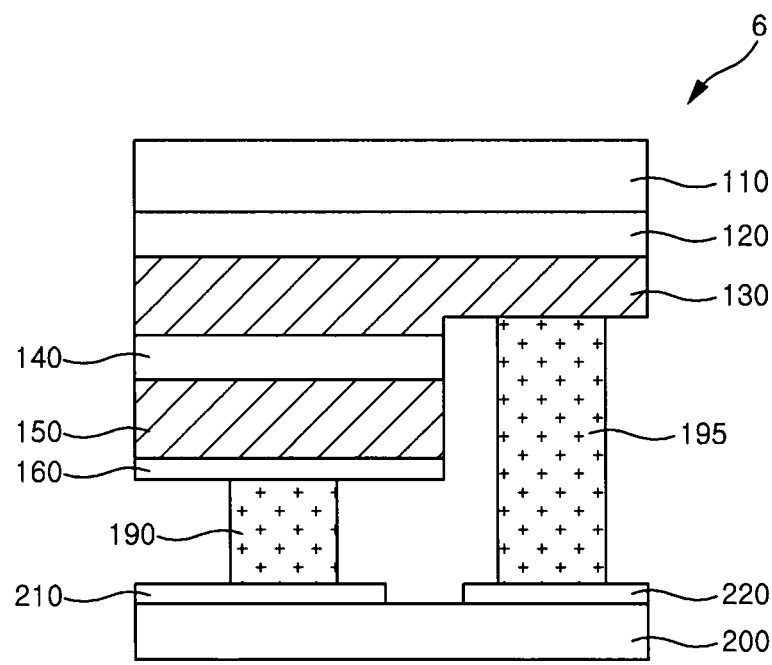
FIG. 8 is a cross sectional view showing a flip chip-type light emitting diode in accordance with a third modification of the present invention.

FIG. 8 is a cross sectional view showing a flip chip-type light emitting diode according to a third modification of the present invention.

As shown in FIG. 8, the flip chip-type light emitting diode comprises a sub-mount substrate 200 having a first external pad 210 and a second external pad 220 thereon, and a horizontal light emitting diode in which an ohmic contact layer 160 and an N-type semiconductor layer 130 are connected via a first metal bump 190 and a second metal bump 195 to the first external pad 210 and the second external pad 220, respectively. The direction of light transmission of the flip chip-type light emitting diode is opposite to the vertical light emitting diode. The sub-mount substrate 200 may be made from a highly reflective material so that the light radiated to the substrate can be entirely reflected.

Described below is a light emitting element which has a plurality of horizontal, vertical or flip-chip type light emitting cells connected to one another in series or in parallel at a wafer level so that it can be operated even with AC power. The first is a horizontal light emitting element, which is not separated into single cells, but connected in cell units at a wafer level so that it can be operated with AC power. In the following description, parts explained above are omitted.

Figure 9:
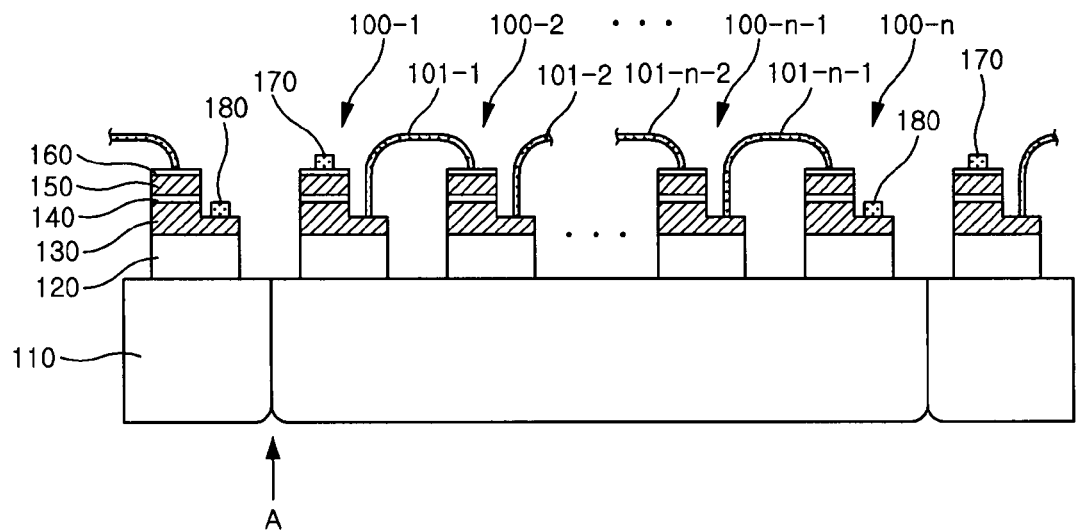
FIGS. 9 and 10 are cross sectional views showing an AC-operable horizontal light emitting diode in accordance with a fourth modification of the present invention.
Figure 10:
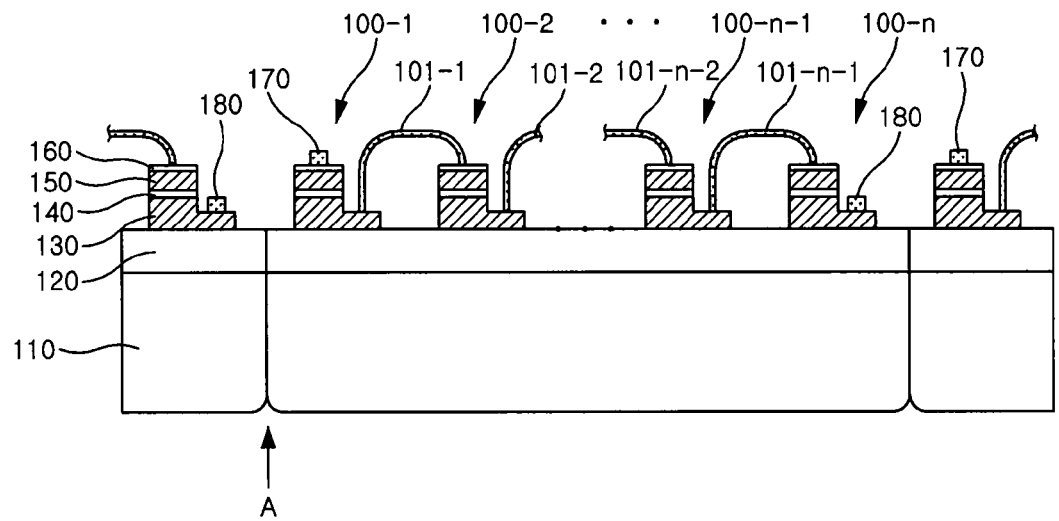

FIGS. 9 and 10 are side cross-sectional views of a fourth modified example of a portion of a horizontal AC driving light emitting diode consistent with this invention.

Referring to FIGS. 9 and 10, the horizontal AC driving light emitting diode of the present invention has a plurality of horizontal light emitting cells 100-1 to 100-$n$ connected to one another in series. That is, the light emitting diode comprises the plurality of horizontal light emitting cells 100 in which the N-type semiconductor layers 130 and the P-type semiconductor layers 150 of the adjacent horizontal light emitting cells 100-1 to 100-$n$ are electrically connected, an N-type pad 180 is formed on the N-type semiconductor layer 130 of a light emitting cell 100-$n$ located at one end of the light emitting element, and a P-type pad 170 is formed on the P-type semiconductor layer 150 of a light emitting cell 100-1 located at the other end thereof.

The N-type semiconductor layers 130 and the P-type semiconductor layers 150 of the adjacent horizontal light emitting cells 100-1 to 100-$n$ are electrically connected to each other using predetermined metallic wires 101. Further, in the present invention, it is effective that the plurality of horizontal light emitting cells 100-1 to 100-$n$ can be connected in series to be driven by a supplied AC voltage. In the present modified example, the number of light emitting cells 100 connected in series or parallel may greatly vary depending on a voltage/current for driving a single light emitting cell 100 and an AC driving voltage applied to a light emitting diode for illumination. Preferably, 10 to 1000 cells are connected in series, and more preferably, it is effective to connect 30 to 70 cells in series. For example, in driving with an AC voltage of 220V, a light emitting diode is manufactured by serially connecting 66 or 67 unit light emitting cells 100 each of which is operated with a voltage of 3.3V at a certain current. Further, in driving with an AC voltage of 110V, a light emitting diode is manufactured by serially connecting 33 or 34 unit light emitting cells 100 each of which is operated with a voltage of 3.3V at a certain current.

As shown in FIGS. 9 and 10, in the light emitting diode with the first to n-th light emitting cells 100-1 to 100-$n$ connected in series, the P-type pad 170 is formed on the P-type semiconductor layer 150 of the first light emitting cell 100-1, and the N-type semiconductor layer 130 of the first light emitting cell 100-1 and the P-type semiconductor layer 150 of the second light emitting cell 100-2 are connected through a first wire 101-1. Further, the N-type semiconductor layer 130 of the second light emitting cell 100-2 and a P-type semiconductor layer of the third light emitting cell (not shown) are connected through a second wire 101-2. An N-type semiconductor layer (not shown) of the (n−2)-th light emitting cell (not shown) and a P-type semiconductor layer 150 of the (n−1)-th light emitting cell 100-$n$−1 are connected through an (n−2)-th wire 101-$n$−2, and an N-type semiconductor layer 130 of the (n−1)-th light emitting cell 100-$n$−1 and a P-type semiconductor layer 150 of the n-th light emitting cell 100-$n$ are connected through an (n−1)-th wire 101-$n$−1. Further, the N-type pad 180 is formed on the N-type semiconductor layer 150 of the n-th light emitting cell 100-$n$. At this time, pads that are metallic electrodes are formed on the respective semiconductor layers so that these pads are connected through wiring.

The substrate 110 in the present modified example may be a substrate on which a plurality of light emitting diodes can be manufactured. Accordingly, a zone designated by "A" as shown FIGS. 9 and 10 refers to a cutting zone for separately cutting the plurality of diodes.

Further, in the aforementioned light emitting diode, first to fourth diodes (not shown) for rectifying an external AC voltage may be formed on an identical substrate. The first to fourth diodes are arranged in the form of a rectification bridge. Rectification nodes among the first to fourth diodes may be connected to N-type or P-type pads of the respective light emitting cells 100 which is connected to one another in series. The first to the fourth diodes may be used for light emitting cells.

A method of manufacturing the light emitting diode with the aforementioned plurality of light emitting cells connected in series will be briefly described below.

The buffer layer 120, the N-type semiconductor layer 130, the active layer 140 and the P-type semiconductor layer 150 are sequentially formed by means of crystal growth on the substrate 110. The ohmic contact layer 160 may be further formed on the P-type semiconductor layer 150.

A portion of the N-type semiconductor layer 130 is opened and each light emitting cell 100 is insulated through a predetermined patterning process. In the patterning process, a photoresist is applied on the whole structure, and a photoresist mask (not shown) with predetermined open regions is formed. The predetermined regions refer to regions between light emitting cells 100 and regions corresponding to portions of the N-type semiconductor layers 130 to be opened. Etching process is performed using the photoresist mask. The P-type semiconductor layer 150, the active layer 140 and a portion of the N-type semiconductor layers 130 are etched so that the portion of the N-type semiconductor layer 130 can be opened. By continuously performing the etching process, each light emitting cell 100 is insulated.

In addition, a portion of the N-type semiconductor layer 130 may be opened each light emitting cell 100 is insulated by performing a plurality of patterning processes. That is, as shown in FIG. 9, a portion of the N-type semiconductor layer 130 is exposed by partially etching the P-type semiconductor layer 150, the active layer 140 and the N-type semiconductor layer 130, and each of the light emitting cells 100 is electrically insulated by etching the P-type semiconductor layer 150, the active layer 140, the N-type semiconductor layer 130 and the buffer layer 120 through an additional process. Moreover, as shown in FIG. 10, when the buffer layer 120 is made from an insulating layer, each of the light emitting cells 100 may be electrically insulated by performing etching only down to the N-type semiconductor layer 130. The etching process used in the patterning processes may be a wet etching process or a dry etching process. It is effective to perform a dry etching process using plasma in this embodiment.

By using a process identical to the aforementioned manufacturing process, diodes for a rectification bridge may be formed together. It will be apparent that diodes for a rectification bridge may be formed through a typical semiconductor manufacturing process.

Thereafter, the conductive wires 100-1 to 100-*n* for electrically connecting the N-type semiconductor layers 130 and the P-type semiconductor layers 150 of the adjacent light emitting cells 100-1 to 100-*n* are formed through a predetermined process such as a bridge process or step coverage. The conductive wires 101-1 to 101-*n* is formed of a conductive material and a silicone compound doped with metal or impurity.

The aforementioned bridge process is also referred to as an air bridge process. The air bridge process, a photoresist solution is applied between light emitting cells to be connected to each other, using a photo process, and a photoresist pattern opened a portion of region of a pad which is a metal electrode posited on the semiconductor layer is developed, and a thin film is first formed thereon through a method such as vacuum vapor deposition with a material such as metal, and a conductive material including gold (Au) is again applied thereon to be a predetermined thickness through a method such as plating or metal vapor deposition. Thereafter, when the photoresist pattern is removed by a solution such as a solvent, all parts below the conductive material are removed and only the conductive material which is a form of a bridge is formed in space.

Further, the step coverage process is electrically connecting between light emitting cells to each other. The step coverage process, a photoresist solution is applied between light emitting cells to be connected to each other, using a photo process, and a photoresist pattern opened a portion of region of a pad which is a metal electrode posited on the semiconductor layer is developed, and a conductive material including gold (Au) is again applied thereon to be a predetermined thickness through a method such as plating or metal vapor deposition.

The aforementioned method of manufacturing the light emitting diode of the present invention is only a specific embodiment and is not limited thereto. Various processes and manufacturing methods may be modified or added depending on the characteristics of a diode and convenience of a process.

AC-operable, vertical light emitting device is explained, below. In the following explanation, parts explained above are omitted.

Figure 11:
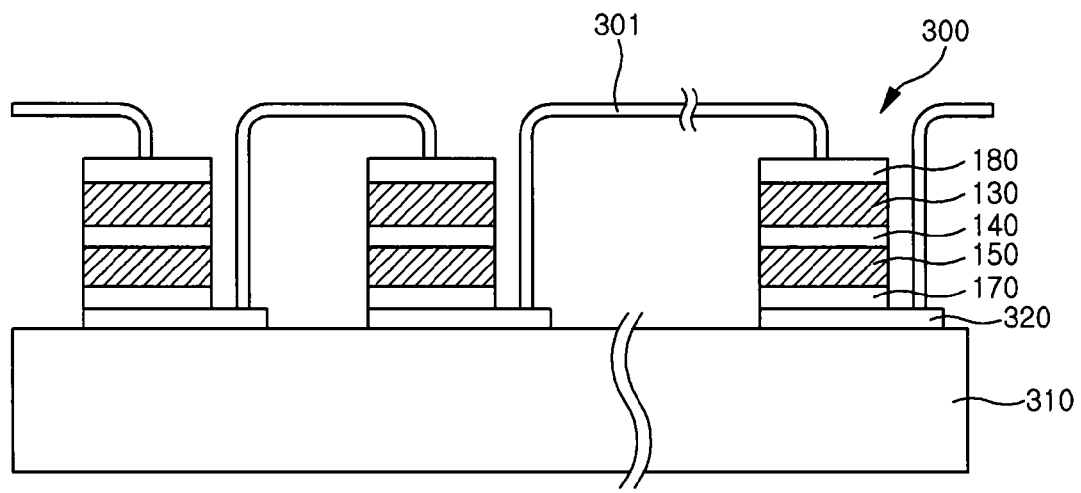
FIGS. 11 to 13 are cross sectional views showing an AC-operable vertical light emitting diode in accordance with a fifth modification of the present invention.
Figure 12:
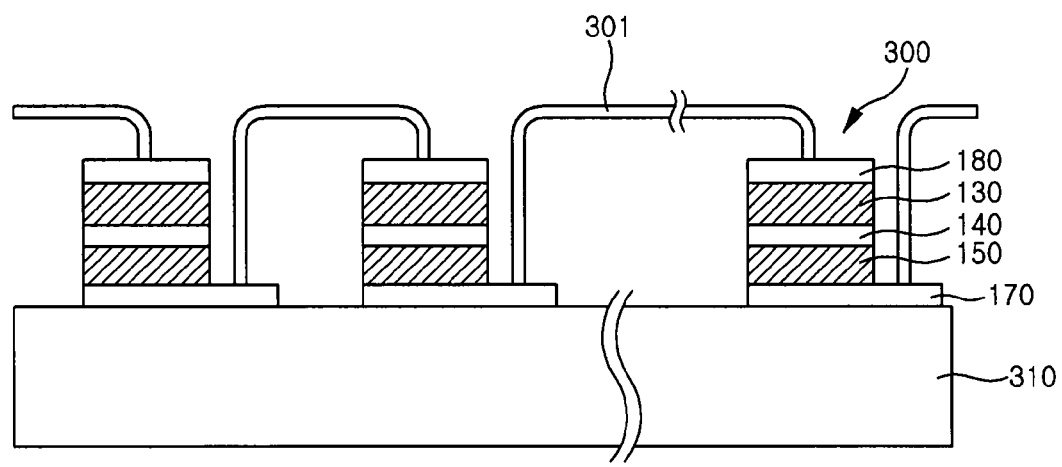
Figure 13:
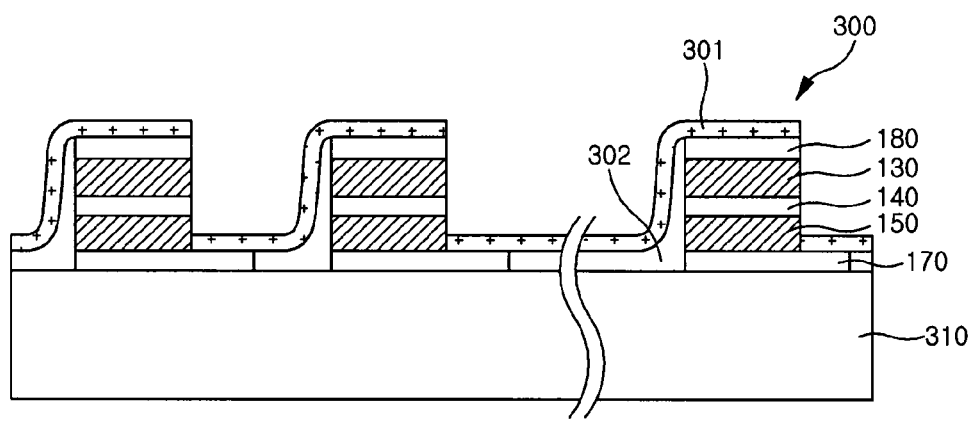

With reference to FIGS. 11 to 13, an AC-operable vertical light emitting diode according to a fifth modification of the present invention is shown in cross sectional views.

As seen in FIGS. 11 to 13, the AC-operable vertical light emitting diode comprises a mount substrate 310 on which a plurality of conductive contact layers 320 is patterned, a plurality of light emitting cells 300 in which P-type bonding pads 170 are formed on respective conductive contact layers, and electrically conductive wires 301 for connecting the conductive contact layers with the vertical light emitting cells.

Through the manufacturing process of the AC-operable vertical light emitting diode, referring to FIG. 11, P-type pads 170 of vertical light emitting cells 300 are bonded to a conductive contact layer 320 of a mount substrate 310.

The conductive contact layer 320 formed on the mount substrate 310 may be arranged in various arrays for serially connecting the light emitting cells 300. It will be apparent that the conductive contact layer 320 are formed as many as the number of desired light emitting cells 300 and broader in width in one direction than that of each of the light emitting cells 300. Further, each conductive contact layer 320 is separated electrically and physically.

At this time, since the conductive contact layer 320 are formed on the mount substrate 310 in this modified example, the conductive contact layer 320 on the mount substrate 310 may be used as the P-type pads 170 without forming the P-type pad 170 on the light emitting cell 300. Further, although the P-type pads 170 are bonded to the mount substrate 310 in this modified example, the N-type pads 180 may be bonded to the mount substrate 310. At this time, the N-type pad 180 may not be formed.

Here, conductive paste is used to bond the P-type pads 170 of the light emitting cells 300 to the conductive contact layer 320 on the mount substrate 310. It will be apparent that they can be bonded using other various bonding methods. At this time, as shown in FIG. 11, the light emitting cell 300 is aligned with one side of the conductive contact layer 320 so that a portion of the other side of the conductive contact layer 320 is exposed.

Thereafter, a conductive contact layer 320 with P-type bonding pad of a light emitting cell 300 bonded thereto is electrically connected using a conductive wire 301 to an N-type pad 180 of an adjacent light emitting cell 300. Therefore, the N-type pad 180 of the light emitting cell 300 is connected through the conductive contact layer 320 and the conductive wire 301 to a P-type pad 170 of the one light emitting cell 300 so that a plurality of light emitting cells 300 are connected in series.

With reference to FIG. 12, a method for fabricating the AC-operable, vertical light emitting diode according to the modification of the present invention is illustrated, but is not limited thereto.

A plurality of vertical light emitting cells 300 each of which has an active layer 140 formed between an N-type semiconductor layer 130 and a P-type semiconductor layer 150, and bonding pads 180 and 170 formed respectively on the N-type semiconductor layer 130 and the P-type semiconductor layer 150 are bonded to a mount substrate 310.

A substrate made of at least one of Al$_2$O$_3$, SiC, ZnO, Si, GaAs, GaP, LiAl$_2$O$_3$, BN, AlN and GaN, an insulating substrate made of resin, plastic or the like, or a substrate with excellent thermal conductivity may be used as the mount substrate 310. If a conductive substrate is used, a substrate with an insulating layer formed thereon is used.

Thereafter, the light emitting cells 300 are bonded to the mount substrate 310 using predetermined paste (not shown). At this time, the P-type pad 170 of the light emitting cell 300 is bonded to the mount substrate 310. It will be apparent that both of them can be bonded using various bonding methods. Although the P-type pad 170 is bonded to the mount substrate 310 in this modified example, the N-type pad 180 may be bonded to the mount substrate 310.

Next, the N-type pad 180, N-type semiconductor layer 130, the active layer 140 and the P-type semiconductor layer 150 are partially etched through a predetermined etching process so that a portion of the P-type pad 170 can be exposed. This achieves a configuration in which a portion of the P-type pad 170 is exposed at a lower portion of the light emitting cell 200, as shown in FIG. 12. Electrodes of adjacent light emitting cells 300 are connected through a predetermined wire forming process. That is, the exposed portion of the P-type pad 170 of one light emitting cell 300 and the N-type pad 180 of another light emitting cell 300 adjacent thereto are connected through a conductive wire 301. At this time, the conductive wire 301 for electrically connecting the N-type pad 180 and the P-type pad 170 of the adjacent light emitting cells 300 are formed through a predetermined process such as a bridge process or step coverage.

An additional external terminal electrode (not shown) is formed on each of the P-type pad 170 of a light emitting cell 300 located at the one end of the light emitting diode of the present modified example and the N-type pad 180 of a light emitting cell 300 located at the other end thereof so that predetermined power can be input from the outside.

Referring to FIG. 13, a method for fabricating an AC-operable, vertical light emitting diode according to the present invention is illustrated.

As described in the previous modified example, vertical light emitting cells 300 are bonded to a mount substrate 310, and a portion of a P-type pad 170 is then exposed through a predetermined etching process.

Thereafter, a predetermined insulation film 302 for preventing a short circuit with subsequent wiring is formed on the mount substrate 310 between the exposed portion of the P-type pad 170 and a light emitting cell 300 adjacent thereto. Then, electrodes of the adjacent light emitting cells 300 are connected through a conductive wire 301 using a predetermined metal wiring process. Such an insulation film 302 and conductive wire 301 may be formed through a printing process or through a predetermined vapor deposition, patterning and etching process.

The manufacture of the light emitting diode is not limited to the aforementioned process. Without performing an etching process for the light emitting cell, an electrode pattern having a width larger than that of the light emitting cell may be formed on the substrate and the light emitting cell may be then bonded to the electrode pattern. Although the P-type pad is bonded to the substrate in this modified example, an N-type pad may be bonded to the substrate.

The aforementioned modified examples are not limited themselves but conversion can be made therebetween. In other words, a plurality of semiconductor layers may be further added to form semiconductor layers. To connect adjacent light emitting cells to one another, the adjacent light emitting cells are electrically insulated by forming additional insulation films, and each electrode is then exposed to connect the adjacent light emitting cells using predetermined wires.

In the following, an AC-operable flip chip-type light emitting diode is explained. In the following description, parts already explained above are omitted.

Figure 14:
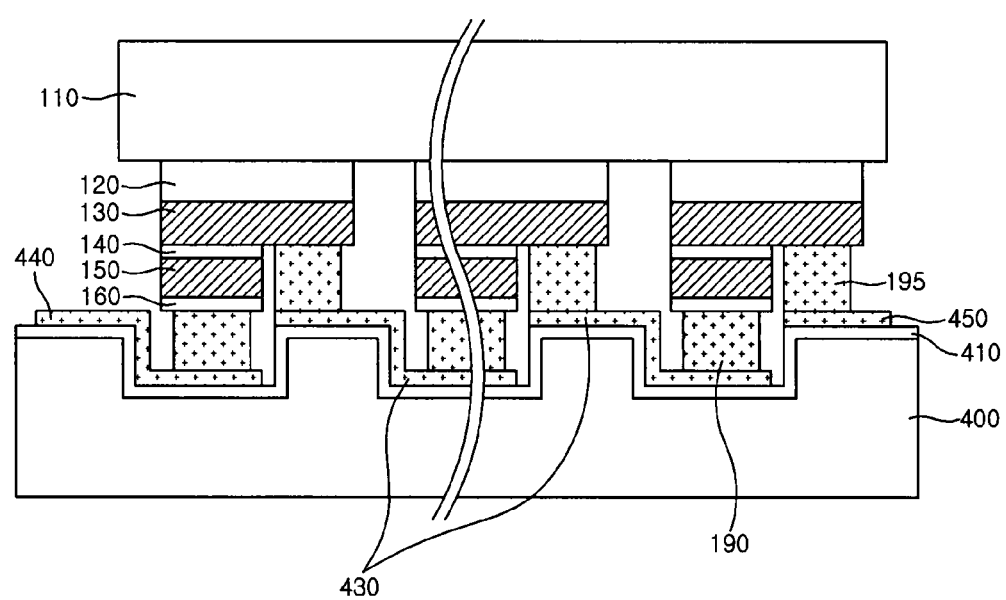
FIGS. 14 and 15 are cross sectional views showing an AC-operable flip chip-type light emitting diode in accordance with a sixth modification of the present invention.
Figure 15:
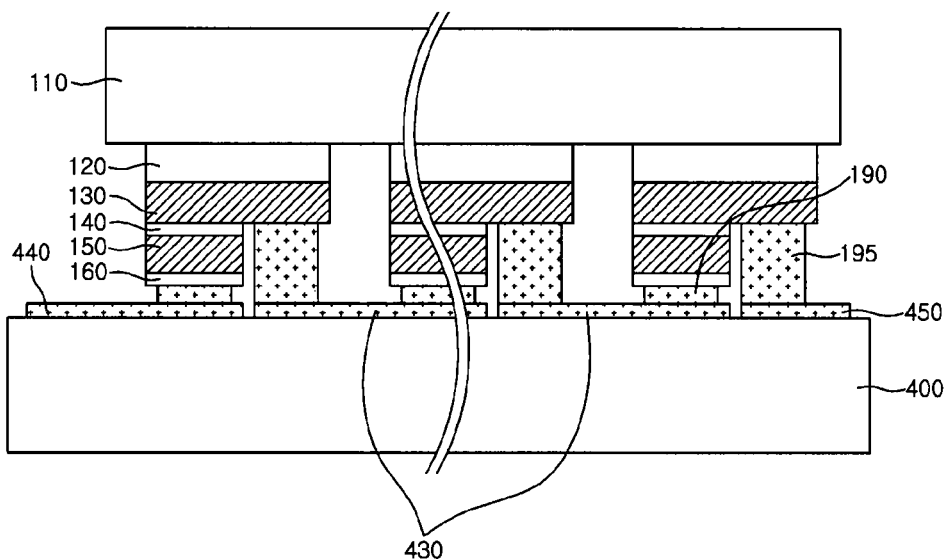

FIGS. 14 and 15 are cross sectional views showing an AC-operable flip chip type light emitting diode in accordance with a sixth modification of the present invention.

As seen in FIGS. 14 and 15, the AC-operable flip chip-type light emitting diode has a plurality of light emitting cells arrayed on a wafer 110. A first metal bumper 190 is formed on an ohmic contact layer 160 of each of the horizontal light emitting cells while a second metal bump 195 is formed on an N-type semiconductor layer.

The wafer 110 on which the horizontal light emitting cells are arrayed is mounted over a lower sub-mount 400.

The sub-mount substrate 400 is covered with a dielectric film 410 on which a plurality of conductive wires 430 is formed, with a first bonding wire 440 and a second bonding wire 450 provided at respective opposite ends.

The sub-mount substrate 400 may be made from various electrically and thermally conductive materials, as exemplified by metal such as SiC, Si, Ge, SiGe, AlN, etc. As for the dielectric film 410, it may be made from all of the dielectric materials which allow an electrical current to flow at a level of 1 μm or less. Alternatively, insulation materials that do not allow the flow of electrical currents may be used. The dielectric film 410 may be formed in a multilayer structure. In this embodiment, the dielectric film 410 is made from one selected from the group consisting of SiO2, MgO, SiN and combinations thereof.

In the following, a method for fabricating a sub-mount substrate for a light emitting diode having the above-mentioned flip chip structure.

First, a sub-mount substrate 400 is patterned to form an embossed shape thereon as shown in FIG. 14. The dielectric film 410 is formed on the embossed surface. When the material for the sub-mount substrate 400 is not electrically conductive, a dielectric film 410 may not be formed. In this embodiment, the sub-mount substrate is made from a metallic material superior in electrical conductivity in order to improve its thermal conductivity. Thus, the dielectric film 410 is provided to function as a good insulator.

Next, a conductive wire 430 is patterned to connect a first and a second metal bumper 190, 195 of a light emitting cell adjacent to the dielectric film 410. In this connection, the conductive wire 430 may be formed using a screen printing method or a vapor deposition process with the aid of a predetermined mask pattern. Subsequently, the light emitting cell is bonded onto a sub-mount substrate 400 to afford a light emitting diode.

Alternatively, as shown in FIG. 15, the conductive wire 430 may be formed on the sub-mount substrate 400 whose surface is not embossed, but flat, followed by bonding a light emitting cell onto the sub-mount substrate 400 to afford a light emitting diode.

The AC-operable light emitting diode, as mentioned above, may be connected to others in series or in parallel, and may have a rectifier circuit therein.

The electrical connection relationship of the light emitting cell present inside the AC-operable light emitting diode will be explained with reference to figures, below.

FIGS. 16 to 19 are conceptual views illustrating the electrical connection of the light emitting cell inside the AC-operable light emitting diode.

Figure 16:
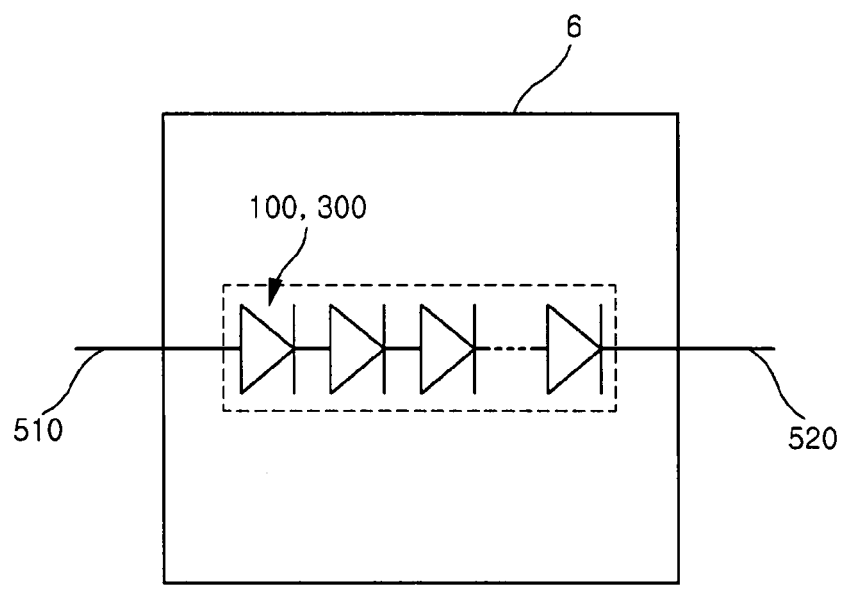
FIGS. 16 to 19 are conceptual views showing the electrical connection relationship of light emitting cells present inside an AC-operable light emitting diode.

In a light emitting diode 6, as shown in FIG. 16, a plurality of light emitting cells 100, 300 are connected in series, with a first and a second external connection pad 510, 520 provided, respectively, at the opposite ends thereof. The light emitting cells having a horizontal, a vertical or a flip chip structure, as described above, can be connected in series on a wafer. When an AC voltage of about 60 Hz is applied to the light emitting diode, a positive voltage (+) allows the light emitting cells 100, 300 in series to emitting light whereas a negative voltage (−) does not allow light emission. However, the voltage is continuously changed from positive to negative and vice versa at a frequency of predetermined Hz, so that the naked eyes feel that light is continuously emitted.

Figure 17:
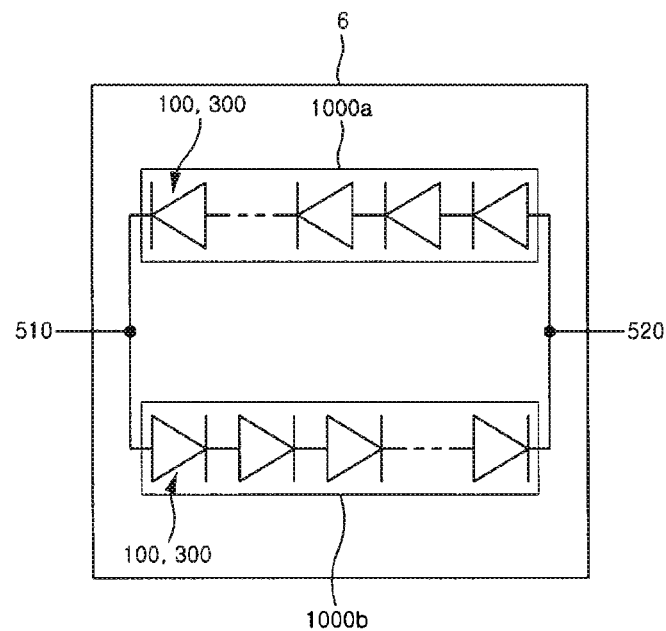

Referring to FIG. 17, at least two light emitting cell blocks 1000a and 1000b each of which has a plurality of serially connected light emitting cells 100 and 300 are connected to each other in reverse parallel between a first and second external connection pad 510, 520. The number of the light emitting cell blocks is more then two. Then it is preferred that the respective numbers of light emitting cells 100 and 300 within the first and second cell blocks 1000a and 1000b be the same to minimize variation in the brightness of the light emitting diode 6.

The operation of the light emitting element according to the present invention constructed as above will be explained below. If a positive (+) voltage is applied to the first external connection pad 510 and a negative (−) voltage is applied to the second external connection pad 520, the second light emitting cell block 1000b emits light. Meanwhile, if a negative (−)

voltage is applied to the first external connection pad 510 and a positive (+) voltage is applied to the second external connection pad 520, the first light emitting cell block 1000a emits light. In other words, since the first and second light emitting cell blocks 1000a and 1000b alternately emit light even though external AC power is applied to the light emitting diode, it is possible to use the light emitting diode even with an AC power source.

In addition, it is possible to manufacture a light emitting diode including an additional bridge unit for a certain rectifying operation.

Figure 18:
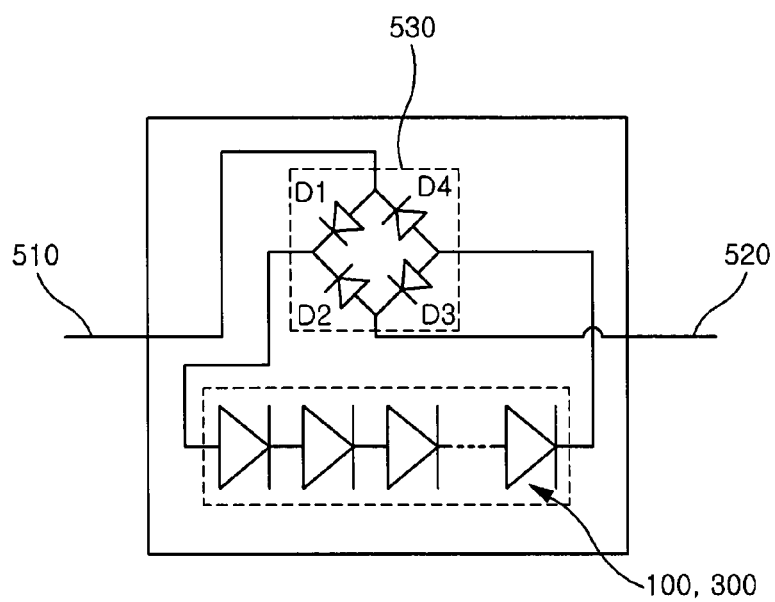
Figure 19:
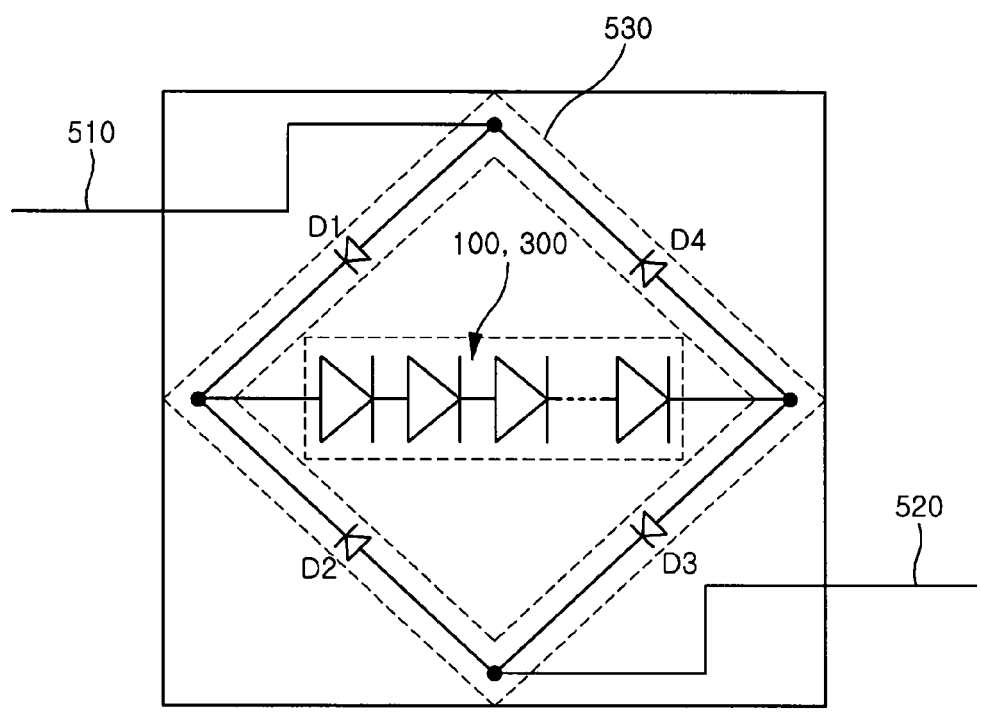

Referring to FIGS. 18 and 19, the light emitting diode of this embodiment comprises a plurality of light emitting cells 100 and 300 connected in series, a rectifying bridge unit 530 for applying a predetermined current to the light emitting cells 100 and 300, and a first and second external connection pad 510 and 520 connected to the rectifying bridge unit 530.

In this embodiment, the plurality of light emitting cells 100 and 300 are electrically connected to an external power source not directly but through the rectifying bridge unit 530 connected to first and second external connection pad 510 and 520. The rectifying bridge unit 530 comprises a first to fourth diode D1, D2, D3 and D4 which are connected through a bridge. Thus, in the rectifying bridge unit 530, a current is applied to the serially connected light emitting cells 100 and 300 through the bridge diodes D1 and D3 arranged in a forward direction when a positive voltage is applied, whereas a current is applied to the serially connected light emitting cells 100 and 300 through the bridge diodes D2 and D4 arranged in a reverse direction when a negative voltage is applied. Accordingly, the light emitting cells continuously emits light regardless of whether a power source is an AC power source.

Figure 20:
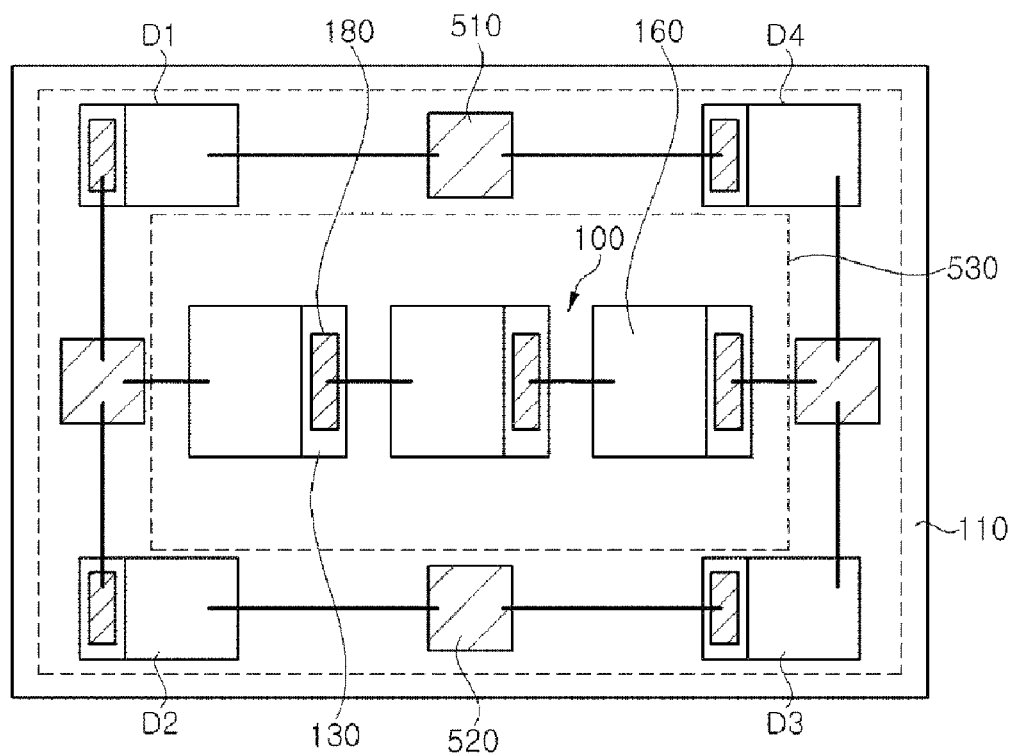
FIG. 20 is a plan view showing the AC-operable light emitting diode of FIG. 19.

A rectifying bridge unit 530 may be provided outside of the plural light emitting cells 100, 300 in series as shown in FIG. 18. Alternatively the plural light emitting cells 100, 300 in series may be constructed inside of the rectifying bridge unit 530 as shown in FIGS. 19 and 20.

Also, various functional circuit diodes may be added. For example, an RC filter for ripple prevention may be additionally used in the light emitting diode.

Luminescent materials on the top and side face of light emitting diode will be explained in detail below.

To achieve these and other objects, as embodied and broadly described herein, luminescent materials for ultraviolet light or visible light excitation are containing copper-alkaline-earth mixed crystals from the basic family of Silicates or Germanates.

Generally, copper activated or co-activated sulphide-phosphors are well known and they are commercial used for cathode ray tubes. The green-emitting ZnS: Cu, Al (wherein, the copper is used as activator and Al is used as co-activator) is very important in CRT applications.

In zinc-sulphide phosphors, the luminescent materials can be classified into five kinds, depending on the relative ratio of the concentration of activators and co-activators (van Gool, W., Philips Res. Rept. Suppl., 3, 1, 1961). Here, the luminescent centers are formed from deep donors or deep acceptors, or by their association at the nearest-neighbor sites (Phosphor Handbook, edited under the Auspice of Phosphor Research Society, CRC Press New York, 1998, S. 238).

Orthophosphates activated by copper (Wanmaker, W. L., and Spier, H. L., JECS 109 (1962), 109), and pyrophosphates, alumosilicates, silicates, and tripolyphosphates all activated by copper are described in "Keith H. Butler, The Pennsylvania State University Press, 1980, S. 281". However, such phosphors can only be used for a short wave U.V. excitation. Because of their unstable chemical properties and their temperature behavior, they cannot be used in fluorescent lamps.

The influence of copper ions as host lattice component in oxygen dominated compounds, activated by rare earth ions such as $Eu^{2+}$, $Ce^{3+}$ and others, has not been yet described. It should to be expected that the incorporation of copper as a host lattice component influences the preferred luminescent-optical properties regarding improved luminescent intensity as well as desirable shifting of emission maxima, color points, and shape of emission spectra and stabilizing of the lattice.

The influence of copper-ions as components in the host lattice should show improved luminescent properties for excitation wavelength higher than 360 nm. In this region of wavelength, both ions do not show own radiation transfers due to the energy levels of their electron configuration, so that any kind of exciting radiation cannot be lost.

Copper doped luminescent materials show improved emission intensities compared to luminescent materials having not these components in the host lattice. Furthermore, as a desirable effect of copper doped luminescent materials shows a shifting of the emission wavelength to higher or to lower energies. For compounds containing copper, these ions do not react as activators in broadest sense. However, the use of these ions leads to an influence on the crystal field splitting as well as the covalence.

The preparation of substances containing copper is complicated due to the possibility of an oxidation of these ions in reducing atmospheres. For the preparation of copper doped compounds, which need reducing atmosphere, special preparation processes are necessary.

The influence on copper in the crystal field is shown in a generally shifting the emission characteristics depending on the substituted ions. In cases of a substitution of Cu for Sr or Ba in Eu-activated aluminates and/or silicates, the emission maximum should be shifted to longer wavelength due to smaller ionic radii of Cu compared with Ba and Sr ionic radii. That leads to a stronger crystal field in the surrounding of the activator ion.

Due to the higher ionic potential of copper as a quotient of ionic charge and ionic radius compared to the bigger alkaline earth ions, the copper ions can attract the neighboring oxygen ions stronger than the alkaline earth ions. So the substitution of the bigger alkaline earth ions Ca, Sr and Ba by copper leads to a stronger crystal field in the surrounding of the activator ions, too. Thus, the shape of emission bands can be influenced, the shifting of the emission peak to longer wavelength is connected in a broadening of the emission curves for band emission. In addition, it should be possible to increase the intensity of emission by substitution of ions copper. Generally, the shifts of emission peaks to longer as well as to shorter wavelength are desirable in the field of LED lighting. Here, it is necessary to realize a fine tuning to get a special wavelength for desired color points as well as for better brightness of optical devices. By using cations, copper, such a fine tuning should be possible.

It is known that some luminescent materials and phosphors are unstable in water, air humidity, water steam or polar solvents. For instance, aluminates with spinell structure or silicates with orthorhomcic as well as akermanite structures show more or less high sensitivity to water, air humidity, water steam or polar solvents due to high basicity. However, due to a higher covalency and a lower basicity, the incorporation of copper in a host lattice should improve this behavior of luminescent materials against water, air humidity and polar solvents if substituted for cations having a high basicity.

The luminescent material is composed of one or more than one compounds of silicate which is expressed in Formula 1, germanate/or germanate-silicate which is expressed in Formula 2:

$$a(M'O) \cdot b(M''O) \cdot c(M'''X) \cdot d(M'''_2O) \cdot e(M''''_2O_3) \cdot f(M'''''_oO_p) \cdot g(SiO_2) \cdot h(M''''''_xO_y) \quad \text{(Formula 1)}$$

and $$a(M'O) \cdot b(M''_2O) \cdot c(M''X) \cdot d(GeO_2) \cdot e(M'''O) \cdot f(M''''_2O_3) \cdot g(M'''''_oO_p) \cdot h(M''''''_xO_y). \quad \text{(Formula 2)}$$

Meanwhile, copper containing mixed crystals are used as a converter for the primary long-wave ultraviolet radiation in the range from 300-400 nm and/or blue radiation in the range from 380-500 nm from one or more single primary elements within a light emitting device to produce light in the visible region of the spectrum up to a high color rendering index Ra>90. And, copper containing mixed crystals characterized in that the phosphors are used in LED as single phosphors and/or in phosphor mixtures with different known phosphors for realizing white light with a color rendering up to a high color rendering >90.

EXAMPLE 1

A copper-alkaline-earth dominated mixed crystal silicate according to Formula 1 as follows:

$$a(M'O) \cdot b(M''O) \cdot c(M'''X) \cdot d(M'''_2O) \cdot e(M''''_2O_3) \cdot f(M'''''_oO_p) \cdot g(SiO_2) \cdot h(M''''''_xO_y) \quad \text{(Formula 1)}$$

wherein M' is Cu;
M" is at least one or more divalent elements from the group consisting of Be, Mg, Ca, Sr, Ba, Zn, Cd, and Mn;
M''' is at least one or more monovalent elements from the group consisting of Li, Na, K, Rb, Cs, Au, and Ag;
M'''' is at least one or more elements from the group consisting of B, Al, Ga, and In;
M''''' is at least one or more elements from the group consisting of Ge, V, Nb, Ta, W, Mo, Ti, Zr, and Hf;
M'''''' is at least one or more elements from the group consisting of Bi, Sn, Sb, Sc, Y, La, Ce, Pr, Nd, Pm, Sm, Eu, Gd, Tb, Dy, Ho, Er, Tm, Yb, and Lu;
X is at least one or more elements from the group consisting of F, Cl, Br, and I;
$0 < a \leq 2$;
$0 < b \leq 8$;
$0 \leq c \leq 4$;
$0 \leq d \leq 2$;
$0 \leq e \leq 2$;
$0 \leq f \leq 2$;
$0 \leq g \leq 10$;
$0 < h \leq 5$;
$1 \leq o \leq 2$;
$1 \leq p \leq 5$;
$1 \leq x \leq 2$; and
$1 \leq y \leq 5$.
shows high luminescence intensities as shown in table 3.

EXAMPLES OF PREPARATION

Preparation of the Phosphor Having Formula:

$Cu_{0.05}Sr_{1.7}Ca_{0.25}SiO_4$:Eu

Starting materials: CuO, BaCO$_3$, ZnO, MgO, SiO$_2$, Eu$_2$O$_3$ and/or any combination thereof.

The starting materials in form of very pure oxides as well as carbonates have been mixed in stoichiometric proportions together with small amounts of flux (NH$_4$Cl). In a first step the mixture will be fired in an alumina crucible at 1,200° C. in an inert gas atmosphere (N$_2$, H$_2$, Ar or noble gas) for 2-4 hours. After pre-firing the material will be milled again. In a second step the mixing will be fired in an alumina crucible at 1,200° C. in weakly reducing atmosphere for additional 2 hours. After that the material will be milled, washed, dried and sieved. The luminescent material has an emission maximum at 592 nm.

TABLE 1

Eu$^{2+}$-activated Cu—Sr—Ca mixed silicate compared with a comparable Eu$^{2+}$-activated Sr—Ca-Silicate at 450 nm excitation wavelength

| | Copper containing compound $Cu_{0.05}Sr_{1.7}Ca_{0.25}SiO_4$:Eu | Comparison without copper $Sr_{1.7}Ca_{0.3}SiO_4$:Eu |
|---|---|---|
| Emission intensity (%) | 104 | 100 |
| Wavelength (nm) | 592 | 588 |

Preparation of the Luminescent Material Having Formula:

Preparation of the Phosphor Having Formula:

$Cu_{0.2}Ba_2Zn_{0.2}Mg_{0.6}Si_2O_7$:Eu

Starting materials: CuO, BaCO$_3$, ZnO, MgO, SiO$_2$, Eu$_2$O$_3$ and/or any combination thereof.

The starting materials in form of very pure oxides as well as carbonates have been mixed in stoichiometric proportions together with small amounts of flux (NH4Cl). In a first step the mixture will be fired in an alumina crucible at 1,100° C. in inert gas atmosphere for 1-2 hours. After pre-firing the material will be milled again. In a second step the mixing will be fired in an alumina crucible at 1,235° C. in reducing atmosphere for 2 hours. After that the material will be milled, washed, dried and sieved. The luminescent material has an emission maximum at 467 nm.

TABLE 2

Eu$^{2+}$-activated Copper containing mixed silicate compared with comparable Eu$^{2+}$-activated silicate without Copper at 400 nm excitation wavelength

| | Copper containing compound $Cu_{0.2}Sr_2Zn_{0.2}Mg_{0.6}Si_2O_7$:Eu | Comparison without copper $Sr_2Zn_2Mg_{0.6}Si_2O_7$:Eu |
|---|---|---|
| Emission intensity (%) | 101.5 | 100 |
| Wavelength (nm) | 467 | 465 |

Results obtained concerning copper containing silicate mixed crystals activated by Rare Earths are shown in table 3.

TABLE 3

Optical properties of some copper-alkaline-earth Silicate mixed crystals excitable by long wave ultraviolet and/or by visible light and their luminous density in % at 400 nm excitation wavelength

| Composition | Possible excitation range in nm | Luminous density at 400 nm excitation compared with no copper containing compounds in % | Peak wave length of copper containing materials in nm | Peak wave length of materials without copper in nm |
|---|---|---|---|---|
| $Cu_{0.02}(Ba,Sr_{0.2},Ca,Zn)_{1.98}SiO_4$:Eu | 360-500 | 108.2 | 565 | 560 |
| $Cu_{0.05}Sr_{1.7}Ca_{0.25}SiO_4$:Eu | 360-470 | 104 | 592 | 588 |
| $Cu_{0.05}Li_{0.002}Sr_{1.5}Ba_{0.448}SiO_4$:Gd,Eu | 360-470 | 102.5 | 557 | 555 |
| $Cu_{0.2}Sr_2Zn_{0.2}Mg_{0.6}Si_2O_7$:Eu | 360-450 | 101.5 | 467 | 465 |
| $Cu_{0.02}Ba_{2.8}Sr_{0.2}Mg_{0.98}Si_2O_8$:Eu,Mn | 360-420 | 100.8 | 440, 660 | 438, 660 |
| $Cu_{0.2}Ba_{2.2}Sr_{0.80}Zn_{0.8}Si_2O_8$:Eu | 360-430 | 100.8 | 448 | 445 |
| $Cu_{0.2}Ba_3Mg_{0.8}Si_{1.99}Ge_{0.01}O_8$:Eu | 360-430 | 101 | 444 | 440 |
| $Cu_{0.5}Zn_{0.5}Ba_2Ge_{0.2}Si_{1.8}O_7$:Eu | 360-420 | 102.5 | 435 | 433 |
| $Cu_{0.8}Mg_{0.2}Ba_3Si_2O_8$:Eu,Mn | 360-430 | 103 | 438, 670 | 435, 670 |
| $Cu_{0.2}Ba_{4.6}Sr_{0.4}Ca_{2.8}Si_4O_{16}$:Eu | 360-470 | 101.8 | 495 | 491 |

EXAMPLE 2

Copper containing mixed crystals with Alkaline Earth germanates and/or germanate-silicates with the formula:

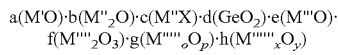

wherein M' is Cu;

M" is at least one or more monovalent elements from the group consisting of Li, Na, K, Rb, Cs, Au, and Ag;

M''' is at least one or more divalent elements from the group consisting of Be, Mg, Ca, Sr, Ba, Zn, Cd, and Mn;

M'''' is at least one or more trivalent elements from the group consisting of Sc, Y, B, Al, Ga, In, and La;

M''''' is at least one or more elements from the group consisting of Si, Ti, Zr, Mn, V, Nd, Nb, Ta, W, Mo and Hf;

M'''''' is at least one or more elements from the group consisting of Bi, Sn, Pr, Sm, Eu, Gd, Dy, and Tb;

X is at least one or more elements from the group consisting of F, Cl, Br, and I;

0<a≤2;
0≤b≤2;
0≤c≤10;
0<d≤10;
0≤e≤14;
0≤f≤14;
0≤g≤10;
0≤h≤2;
1≤o≤2;
1≤p≤5;
1≤x≤2; and
1≤y≤5.

show better luminescence intensities than compounds without Copper (table 4).

Preparation of the Phosphor with Following Formula:

Starting materials: CuO, SrCO₃, GeO₂, SiO₂, MnCO₃ and/or any combination thereof.

The starting materials in form of oxides as well as carbonates have been mixed in stoichiometric proportions together with small amounts of flux (NH₄Cl). In a first step the mixture will be fired in an alumina crucible at 1,100° C. in oxygen containing atmosphere for 2 hours. After pre-firing the material will be milled again. In a second step the mixing will be fired in an alumina crucible at 1,180° C. in oxygen containing atmosphere for 4 hours again. After that the material will be milled, washed, dried and sieved. The phosphor has an emission maximum at 658 nm.

TABLE 4

Mn-activated Cu—Sr mixed germanate-silicate compared with Mn-activated germanate-silicate without Copper at 400 nm excitation wavelength

| | Copper doped compound $Cu_{0.46}Sr_{0.54}Ge_{0.6}Si_{0.4}O_3$:Mn | Comparison without copper $SrGe_{0.6}Si_{0.4}O_3$:Mn |
|---|---|---|
| Emission intensity (%) | 103 | 100 |
| Wavelength (nm) | 658 | 655 |

Results obtained in respect to copper containing Alkaline Earth mixed crystals from the group consisting of germanates or germanate-silicates are shown in table 5.

TABLE 5

Optical properties of some copper containing Germanate/Germanate-Silicate mixed crystals excitable by long wave ultraviolet and/or by visible light and their luminous density in % at 400 nm excitation wavelength

| Composition | Possible excitation range in nm | Luminous density at 400 nm excitation compared with no copper containing compounds in % | Peak wave length of copper containing mixed crystals in nm | Peak wave length of materials without copper in nm |
|---|---|---|---|---|
| $Cu_{0.46}Sr_{0.54}Ge_{0.6}Si_{0.4}O_3$:Mn | 360-400 | 103 | 658 | 655 |
| $Cu_{0.02}Sr_{0.38}Ba_{0.90}Ca_{0.6}Si_{0.98}Ge_{0.02}O_4$:$Eu_{0.1}$ | 360-470 | 102 | 563 | 560 |
| $Cu_{1.45}Mg_{26.55}Ge_{9.4}Si_{0.6}O_{48}$:Mn | 360-400 | 102 | 660 | 657 |

TABLE 5-continued

Optical properties of some copper containing Germanate/Germanate-Silicate mixed crystals excitable by long wave ultraviolet and/or by visible light and their luminous density in % at 400 nm excitation wavelength

| Composition | Possible excitation range in nm | Luminous density at 400 nm excitation compared with no copper containing compounds in % | Peak wave length of copper containing mixed crystals in nm | Peak wave length of materials without copper in nm |
|---|---|---|---|---|
| $Cu_{1.2}Mg_{26.8}Ge_{8.9}Si_{1.1}O_{48}$:Mn | 360-400 | 103.8 | 670 | 656 |
| $Cu_4Mg_{20}Zn_4Ge_5Si_{2.5}O_{38}F_{10}$:Mn | 360-400 | 101.5 | 658 | 655 |
| $Cu_{0.05}Mg_{4.95}GeO_6F_2$:Mn | 360-400 | 100.5 | 655 | 653 |
| $Cu_{0.05}Mg_{3.95}GeO_{5.5}F$:Mn | 360-400 | 100.8 | 657 | 653 |

In respect to changes in some properties of the compounds under consideration by introducing Cu the following physico-chemical changes could be achieved:

TABLE 6 changes of lattice parameters - results of x ray diffractometry

| Phosphor composition | $a_0$ | $b_0$ | $c_0$ |
|---|---|---|---|
| (Ba,Sr,Ca,Eu)—$SiO_4$ without copper | 5.691 | 7.190 | 9.775 |
| (Ba,Sr,Ca,Eu)—$SiO_4$:0.005 Mol Cu | 5.688 | 7.185 | 9.777 |
| (Ba,Sr,Ca,Eu)—$SiO_4$:0.1 Mol Cu | 5.684 | 7.180 | 9.779 |

As shown in Table 6, caused by the slight changes of the lattice parameters of the phosphor contained copper, a slight change in the emission spectra can be observed. In general a shift of 0.5-1.0 nm to shorter wavelengths occurs.

TABLE 7 changes in Zeta potential and mobility of phosphors containing different concentration of copper compared with phosphors without copper.

| Phosphor composition | Zeta-potential | Mobility |
|---|---|---|
| (Ba,Sr,Ca,Eu)—$SiO_4$ without copper | −3.5 mV | $-2.4 \cdot 10^{-5}$ $cm^2$/Vs |
| (Ba,Sr,Ca,Eu)—$SiO_4$:0.005 Mol Cu | −3.3 mV | $-2.3 \cdot 10^{-5}$ $cm^2$/Vs |
| (Ba,Sr,Ca,Eu)—$SiO_4$:0.01 Mol Cu | −2.5 mV | $-1.8 \cdot 10^{-5}$ $cm^2$/Vs |
| (Ba,Sr,Ca,Eu)—$SiO_4$:0.1 Mol Cu | +0.33 mV | $+1.4 \cdot 10^{-6}$ $cm^2$/Vs |

Result of these changes are changes in sensitivity against water. The water stability of copper containing compounds are much higher than the water stability of compounds without copper. (table 8)

TABLE 8 time related relative intensity of compounds with and without copper at 85° C. and at 100% humidity.

| Phosphor composition | rel. intensity after 24 h | rel. intensity after 100 h | rel. intensity after 200 h | rel. intensity after 500 h | rel. intensity after 1000 h |
|---|---|---|---|---|---|
| (Ba,Sr,Ca,Eu)—$SiO_4$ without copper | 98.3 | 96.0 | 93.3 | 84.7 | 79.3 |
| (Ba,Sr,Ca,Eu)—$SiO_4$:0.005 Mol Cu | 100.0 | 99.6 | 98.6 | 96.3 | 94.0 |
| (Ba,Sr,Ca,Eu)—$SiO_4$:0.01 Mol Cu | 98.6 | 98.5 | 95.8 | 92.8 | 90.1 |
| (Ba,Sr,Ca,Eu)—$SiO_4$:0.1 Mol Cu | 98.7 | 98.0 | 96.4 | 93.2 | 90.0 |

As shown in Table 7 and 8, this is caused by the decreasing mobility of the Alkaline Earths ions in the dissolving process. That means the rate and from this number of dissolved cations becomes lower resulting in lower hydrolysis and higher water stability.

Phosphor containing Copper according to the present invention with improved luminescent properties and also with improved stability against water, humidity as well as other polar solvents are provided.

Further, phosphor of inside the light emitting device is mixed with the another phosphor so as to has a high correlated color temperature range from about 2,000K to 8,000K or 10,000K and CRI up to over 90.

In addition, in the present invention, desired color temperature or specific color coordination can be provided.

By using phosphors like above such a light emitting device is capable of applying on mobile phone, note book and electronic devices such as stereo, telecommunication products, but also for custom display's key pad and back light application. Moreover, it can be applied for automobile, medical instrument, measuring instrument and illumination products.

What is claimed is:

1. A light emitting device, comprising:
   at least one light emitting diode capable of producing light in a first wavelength region, the at least one light emitting diode comprising a plurality of light emitting cells connected to one another in series on a single growth substrate; and
   a phosphor comprising a compound which includes copper and an alkaline earth metal as host lattice components and is activated by at least one rare earth element, said phosphor being positioned around the light emitting diode so as to absorb a portion of the light emitted from the light emitting diode and to emit light different in wavelength from the absorbed light,
   wherein the plurality of light emitting cells connected in series are arranged inside a rectifying bridge for applying rectified power to the plurality of light emitting cells, the rectifying bridge being arranged on the single growth substrate together with the light emitting cells, and wherein each light emitting cell comprises an n-type semiconductor layer, an active layer disposed on the n-type semiconductor layer, and a p-type semiconductor layer disposed on the active layer, and the n-type semiconductor layer, the active layer, and the p-type semiconductor layer comprise crystals grown on the single growth substrate.

2. The light emitting diode according to claim 1, wherein the compound includes a copper-alkaline-earth dominated mixed crystal silicate with Formula 1

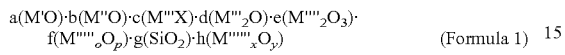
(Formula 1)

wherein M' is Cu;

M" is at least one or more divalent elements from the group consisting of Be, Mg, Ca, Sr, Ba, Zn, Cd, and Mn;

M''' is at least one or more monovalent elements from the group consisting of Li, Na, K, Rb, Cs, Au, and Ag;

M'''' is at least one or more elements from the group consisting of B, Al, Ga, and In;

M''''' is at least one or more elements from the group consisting of Ge, V, Nb, Ta, W, Mo, Ti, Zr, and Hf;

M'''''' is at least one or more elements from the group consisting of Bi, Sn, Sb, Sc, Y, La, Ce, Pr, Nd, Pm, Sm, Eu, Gd, Tb, Dy, Ho, Er, Tm, Yb, and Lu;

X is at least one or more elements from the group consisting of F, Cl, Br, and I;

$0 < a \le 2$;
$0 < b \le 8$;
$0 \le c \le 4$;
$0 \le d \le 2$;
$0 \le e \le 2$;
$0 \le f \le 2$;
$0 \le g \le 10$;
$0 < h \le 5$;
$1 \le o \le 2$;
$1 \le p \le 5$;
$1 \le x \le 2$; and
$1 \le y \le 5$.

3. The light emitting diode according to claim 1, wherein the compound includes a copper-alkaline-earth dominated mixed crystal germanate and/or a germanate-silicate with Formula 2

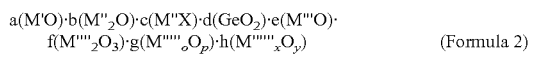
(Formula 2)

wherein M' is Cu;

M" is at least one or more monovalent elements from the group consisting of Li, Na, K, Rb, Cs, Au, and Ag;

M''' is at least one or more divalent elements from the group consisting of Be, Mg, Ca, Sr, Ba, Zn, Cd, and Mn;

M'''' is at least one or more trivalent elements from the group consisting of Sc, Y, B, Al, Ga, In, and La;

M''''' is at least one or more elements from the group consisting of Si, Ti, Zr, Mn, V, Nd, Nb, Ta, W, Mo and Hf;

M'''''' is at least one or more elements from the group consisting of Bi, Sn, Pr, Sm, Eu, Gd, Dy, and Tb;

X is at least one or more elements from the group consisting of F, Cl, Br, and I; and $0 < a \le 2$;
$0 \le b \le 2$;
$0 \le c \le 10$;
$0 < d \le 10$;
$0 \le e \le 14$;
$0 \le f \le 14$;
$0 \le g \le 10$;
$0 \le h \le 2$;
$1 \le o \le 2$;
$1 \le p \le 5$;
$1 \le x \le 2$; and
$1 \le y \le 5$.

4. The light emitting device according to claim 3, wherein a concentration of Strontium is preferably less than 0.4 Mol/Mol. phosphor.

5. The light emitting device according to claim 1, wherein the said compound converts one or more ultraviolet radiation in the range of 300-400 nm and/or blue radiation in the range of 380-500 nm to produce light in the visible region of the spectrum up to a high color rendering index Ra>90.

6. The light emitting device according to claim 1, wherein the compound is used in the at least one light emitting diode as a single phosphor and/or a mixture of a plurality of single phosphors for realizing white light with a color rendering up to Ra>90.

7. The light emitting device according to claim 1, wherein the phosphor may be placed on at least one of the top, side, bottom faces of the least one light emitting diode, or mixed with paste or sealing material.

8. The light emitting device according to claim 1, wherein the at least one light emitting diode and the phosphor are contained in a package.

9. The light emitting device according to claim 8, wherein the package has the at least one light emitting diode mounted on the reflector-formed substrate, with the phosphor arranged around the light emitting diode.

10. The light emitting device according to claim 9, wherein the at least one light emitting diode and the phosphors are sealed with a molding portion.

11. The light emitting device according to claim 10, wherein the phosphors are distributed in the molding portion.

12. The light emitting device according to claim 8, wherein the package comprises a heat sink for dissipating the heat generated from the light emitting diode, with the phosphor arranged around the light emitting diode, and can be adapted for high power.

13. The light emitting device according to claim 1, wherein the plurality of light emitting cells have a horizontal structure.

* * * * *